(12) United States Patent  (10) Patent No.: US 8,044,412 B2
Murphy et al.  (45) Date of Patent: Oct. 25, 2011

(54) PACKAGE FOR A LIGHT EMITTING ELEMENT

(75) Inventors: Thomas Murphy, Berlin (DE); Andreas A. Hase, Berlin (DE); Matthias Heschel, Copenhagen (DK)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 167 days.

(21) Appl. No.: 12/257,203

(22) Filed: Oct. 23, 2008

(65) Prior Publication Data

US 2009/0101897 A1   Apr. 23, 2009

Related U.S. Application Data

(63) Continuation-in-part of application No. 11/336,094, filed on Jan. 20, 2006, now Pat. No. 7,528,422.

(51) Int. Cl.
  *H01L 27/15* (2006.01)
  *H01L 29/267* (2006.01)
  *H01L 31/12* (2006.01)
  *H01L 33/00* (2006.01)

(52) U.S. Cl. .......................................... 257/81; 257/99

(58) Field of Classification Search ................. 257/81, 257/82, 99, 100, 431, 432, 433
  See application file for complete search history.

(56) References Cited

U.S. PATENT DOCUMENTS

| | | |
|---|---|---|
| 4,780,752 A | 10/1988 | Angerstein et al. |
| 5,019,746 A | 5/1991 | Merg |
| 5,035,483 A | 7/1991 | Waitl et al. |
| 5,040,868 A | 8/1991 | Waitl et al. |
| 5,119,174 A | 6/1992 | Chen |
| 5,177,593 A | 1/1993 | Abe |
| 5,187,547 A | 2/1993 | Niina et al. |
| 5,221,641 A | 6/1993 | Kurita et al. |
| 5,243,200 A | 9/1993 | Kawasaki et al. |
| 5,266,817 A | 11/1993 | Lin |
| 5,298,768 A | 3/1994 | Okazaki et al. |
| 5,340,993 A | 8/1994 | Salina et al. |
| 5,485,317 A | 1/1996 | Perissinotto et al. |
| 5,514,627 A | 5/1996 | Lowery et al. |
| 5,534,718 A | 7/1996 | Chang |
| 5,564,819 A | 10/1996 | Yamaguchi |
| 5,635,115 A | 6/1997 | Konishi et al. |
| 5,656,847 A | 8/1997 | Okazaki et al. |
| 5,865,529 A | 2/1999 | Yan |
| 5,875,205 A | 2/1999 | Spaeth et al. |
| 5,893,723 A | 4/1999 | Yamanaka |
| 5,907,151 A | 5/1999 | Gramann et al. |
| 5,914,501 A | 6/1999 | Antle et al. |
| 5,925,898 A | 7/1999 | Spath |
| 5,962,971 A | 10/1999 | Chen |

(Continued)

FOREIGN PATENT DOCUMENTS

EP   0 684 648   5/1995

(Continued)

*Primary Examiner* — S. V Clark

(74) *Attorney, Agent, or Firm* — Haynes and Boone, LLP

(57) ABSTRACT

A high-brightness LED module includes a substrate with a recess in which a light emitting element is mounted. The recess is defined by a sidewalls and a relatively thin membrane. At least two micro-vias are provided in the membrane and include conductive material that passes through the membrane. A p-contact of the light emitting element is coupled to a first micro-via and an n-contact of the light emitting element is coupled to a second micro-via.

55 Claims, 11 Drawing Sheets

U.S. PATENT DOCUMENTS

| | | | |
|---|---|---|---|
| 5,981,945 | A | 11/1999 | Spaeth et al. |
| 5,981,979 | A | 11/1999 | Brunner |
| 5,985,696 | A | 11/1999 | Brunner et al. |
| 5,990,497 | A | 11/1999 | Kamakura et al. |
| 5,999,151 | A | 12/1999 | Michael |
| 6,054,716 | A | 4/2000 | Sonobe et al. |
| 6,060,729 | A | 5/2000 | Suzuki et al. |
| 6,066,861 | A | 5/2000 | Hohn et al. |
| 6,084,252 | A | 7/2000 | Isokawa et al. |
| 6,091,078 | A | 7/2000 | Codama |
| 6,091,084 | A | 7/2000 | Fujii |
| 6,155,699 | A | 12/2000 | Miller et al. |
| 6,169,295 | B1 | 1/2001 | Koo |
| 6,184,544 | B1 | 2/2001 | Toda et al. |
| 6,219,074 | B1 | 4/2001 | Chosa et al. |
| 6,225,139 | B1 | 5/2001 | Tsung-Wen |
| 6,242,760 | B1 | 6/2001 | Hamaguchi et al. |
| 6,245,259 | B1 | 6/2001 | Hohn et al. |
| 6,274,890 | B1 | 8/2001 | Oshio et al. |
| 6,274,924 | B1 | 8/2001 | Carey et al. |
| 6,277,301 | B1 | 8/2001 | Hohn et al. |
| 6,316,285 | B1 | 11/2001 | Jiang et al. |
| 6,328,456 | B1 | 12/2001 | Mize |
| 6,333,522 | B1 | 12/2001 | Inoue et al. |
| 6,340,824 | B1 | 1/2002 | Komoto et al. |
| 6,355,946 | B1 | 3/2002 | Ishinaga |
| 6,365,920 | B1 | 4/2002 | Abramov et al. |
| 6,407,411 | B1 | 6/2002 | Wojnarowski et al. |
| 6,429,460 | B1 | 8/2002 | Chen et al. |
| 6,429,464 | B1 | 8/2002 | Lin |
| 6,459,130 | B1 | 10/2002 | Arndt et al. |
| 6,469,321 | B2 | 10/2002 | Arndt |
| 6,472,765 | B1 | 10/2002 | Sano et al. |
| 6,483,160 | B2 | 11/2002 | Engelhardt et al. |
| 6,492,725 | B1 | 12/2002 | Loh et al. |
| 6,501,103 | B1 | 12/2002 | Jory et al. |
| 6,507,049 | B1 | 1/2003 | Yeager et al. |
| 6,509,584 | B2 | 1/2003 | Suzuki |
| 6,509,651 | B1 | 1/2003 | Matsubara et al. |
| 6,518,600 | B1 | 2/2003 | Shaddock |
| 6,521,916 | B2 | 2/2003 | Roberts et al. |
| 6,525,386 | B1 | 2/2003 | Mills et al. |
| 6,531,328 | B1 | 3/2003 | Chen |
| 6,534,330 | B2 | 3/2003 | Sakamoto et al. |
| 6,552,368 | B2 | 4/2003 | Tamai et al. |
| 6,558,970 | B2 | 5/2003 | Sakamoto et al. |
| 6,561,680 | B1 | 5/2003 | Shih |
| 6,573,580 | B2 | 6/2003 | Arndt |
| 6,573,653 | B1 | 6/2003 | Ishinaga |
| 6,576,930 | B2 | 6/2003 | Reeh et al. |
| 6,578,989 | B2 | 6/2003 | Osumi et al. |
| 6,583,444 | B2 | 6/2003 | Fjelstad |
| 6,583,447 | B2 | 6/2003 | Wang et al. |
| 6,586,721 | B2 | 7/2003 | Estevez-Garcia |
| 6,592,780 | B2 | 7/2003 | Hohn et al. |
| 6,593,598 | B2 | 7/2003 | Ishinaga |
| 6,597,019 | B2 | 7/2003 | Inoue et al. |
| 6,599,768 | B1 | 7/2003 | Chen |
| 6,600,175 | B1 | 7/2003 | Baretz et al. |
| 6,600,231 | B2 | 7/2003 | Tominaga |
| 6,603,148 | B1 | 8/2003 | Sano et al. |
| 6,608,329 | B1 | 8/2003 | Chen |
| 6,608,334 | B1 | 8/2003 | Ishinaga |
| 6,610,563 | B1 | 8/2003 | Waitl et al. |
| 6,613,247 | B1 | 9/2003 | Hohn et al. |
| 6,614,058 | B2 | 9/2003 | Lin et al. |
| 6,614,103 | B1 | 9/2003 | Durocher et al. |
| 6,614,172 | B2 | 9/2003 | Chiu et al. |
| 6,617,400 | B2 | 9/2003 | Yeager et al. |
| 6,617,401 | B2 | 9/2003 | Rubinsztajn |
| 6,617,787 | B2 | 9/2003 | Kato et al. |
| 6,624,491 | B2 | 9/2003 | Waitl et al. |
| 6,632,892 | B2 | 10/2003 | Rubinsztajn et al. |
| 6,642,072 | B2 | 11/2003 | Inoue et al. |
| 6,642,618 | B2 | 11/2003 | Yagi et al. |
| 6,645,783 | B1 | 11/2003 | Brunner et al. |
| 6,653,661 | B2 | 11/2003 | Okazaki |
| 6,657,235 | B1 | 12/2003 | Verdonk et al. |
| 6,661,030 | B2 | 12/2003 | Komoto et al. |
| 6,661,032 | B2 | 12/2003 | Meng et al. |
| 6,677,614 | B1 | 1/2004 | Komoto et al. |
| 6,680,490 | B2 | 1/2004 | Yasukawa et al. |
| 6,680,568 | B2 | 1/2004 | Fujiwara et al. |
| 6,700,137 | B2 | 3/2004 | Horiuchi et al. |
| 6,707,069 | B2 | 3/2004 | Song et al. |
| 6,710,377 | B2 | 3/2004 | Shimomura |
| 6,730,533 | B2 | 5/2004 | Durocher et al. |
| 6,730,939 | B2 | 5/2004 | Eisert et al. |
| 6,733,711 | B2 | 5/2004 | Durocher et al. |
| 6,734,465 | B1 | 5/2004 | Taskar et al. |
| 6,734,466 | B2 | 5/2004 | Chua |
| 6,741,029 | B2 | 5/2004 | Matsubara et al. |
| 6,746,295 | B2 | 6/2004 | Sorg |
| 6,747,293 | B2 | 6/2004 | Nitta et al. |
| 6,756,610 | B2 | 6/2004 | Sakamoto et al. |
| 6,759,733 | B2 | 7/2004 | Arndt |
| 6,759,803 | B2 | 7/2004 | Sorg |
| 6,759,804 | B2 | 7/2004 | Ellens et al. |
| 6,774,401 | B2 | 8/2004 | Nakada et al. |
| 6,774,406 | B2 | 8/2004 | Isoda |
| 6,791,116 | B2 | 9/2004 | Takahashi et al. |
| 6,800,373 | B2 | 10/2004 | Gorczyca |
| 6,803,606 | B2 | 10/2004 | Takenaka |
| 6,803,608 | B1 | 10/2004 | Chen |
| 6,806,506 | B2 | 10/2004 | Tsuji |
| 6,806,509 | B2 | 10/2004 | Yoshino et al. |
| 6,806,583 | B2 | 10/2004 | Koay et al. |
| 6,806,658 | B2 | 10/2004 | Tan et al. |
| 6,808,950 | B2 | 10/2004 | Komoto et al. |
| 6,809,162 | B2 | 10/2004 | Rubinsztajn |
| 6,809,342 | B2 | 10/2004 | Harada |
| 6,812,481 | B2 | 11/2004 | Matsumura et al. |
| 6,812,500 | B2 | 11/2004 | Reeh et al. |
| 6,812,503 | B2 | 11/2004 | Lin et al. |
| 6,818,464 | B2 | 11/2004 | Heschel |
| 6,828,590 | B2 | 12/2004 | Hsiung |
| 6,828,599 | B2 | 12/2004 | Kim |
| 6,830,496 | B2 | 12/2004 | Lin et al. |
| 6,831,305 | B2 | 12/2004 | Yasukawa et al. |
| 6,833,565 | B2 | 12/2004 | Su et al. |
| 6,835,960 | B2 | 12/2004 | Lin et al. |
| 6,841,802 | B2 | 1/2005 | Yoo |
| 6,841,933 | B2 | 1/2005 | Yamanaka et al. |
| 6,849,867 | B2 | 2/2005 | Roberts et al. |
| 6,849,876 | B1 | 2/2005 | Chen et al. |
| 6,855,958 | B2 | 2/2005 | Sato et al. |
| 6,856,087 | B2 | 2/2005 | Lin et al. |
| 6,856,717 | B2 | 2/2005 | Kilian |
| 6,858,869 | B2 | 2/2005 | Fujiwara |
| 6,858,870 | B2 | 2/2005 | Lee |
| 6,858,879 | B2 | 2/2005 | Waitl et al. |
| 6,858,880 | B2 | 2/2005 | Horiuchi et al. |
| 6,860,621 | B2 | 3/2005 | Bachl et al. |
| 6,861,677 | B2 | 3/2005 | Che |
| 6,864,567 | B2 | 3/2005 | Yu |
| 6,869,813 | B2 | 3/2005 | Okazaki |
| 6,870,311 | B2 | 3/2005 | Mueller et al. |
| 6,874,910 | B2 | 4/2005 | Sugimoto et al. |
| 6,876,008 | B2 | 4/2005 | Bhat et al. |
| 6,876,149 | B2 | 4/2005 | Miyashita |
| 6,878,783 | B2 | 4/2005 | Yeager et al. |
| 6,881,980 | B1 | 4/2005 | Ting |
| 6,888,168 | B2 | 5/2005 | Fjelstad |
| 6,888,169 | B2 | 5/2005 | Malone et al. |
| 6,888,174 | B2 | 5/2005 | Hohn et al. |
| 6,897,486 | B2 | 5/2005 | Loh |
| 6,897,490 | B2 | 5/2005 | Brunner et al. |
| 6,900,511 | B2 | 5/2005 | Ruhnau et al. |
| 6,903,380 | B2 | 6/2005 | Barnett et al. |
| 6,903,382 | B2 | 6/2005 | Ho |
| 6,909,123 | B2 | 6/2005 | Hayashimoto et al. |
| 6,909,234 | B2 | 6/2005 | Chen |
| 6,911,731 | B2 | 6/2005 | Wu |
| 6,916,889 | B2 | 7/2005 | Rubinsztajn et al. |
| 6,917,057 | B2 | 7/2005 | Stokes et al. |
| 6,919,582 | B2 | 7/2005 | Chen |
| 6,921,674 | B2 | 7/2005 | Horiuchi et al. |

| Patent | Kind | Date | Inventor |
|---|---|---|---|
| 6,921,922 | B2 | 7/2005 | Kobinata et al. |
| 6,921,926 | B2 | 7/2005 | Hsu |
| 6,921,927 | B2 | 7/2005 | Ng et al. |
| 6,922,024 | B2 | 7/2005 | Yano et al. |
| 6,924,514 | B2 | 8/2005 | Suenaga |
| 6,930,332 | B2 | 8/2005 | Hashimoto et al. |
| 6,936,855 | B1 | 8/2005 | Harrah |
| 6,936,862 | B1 | 8/2005 | Chang et al. |
| 6,940,102 | B2 | 9/2005 | Takekuma |
| 6,943,379 | B2 | 9/2005 | Suehiro et al. |
| 6,943,380 | B2 | 9/2005 | Ota et al. |
| 6,943,433 | B2 | 9/2005 | Kamada |
| 6,946,714 | B2 | 9/2005 | Waitl et al. |
| 6,949,772 | B2 | 9/2005 | Shimizu et al. |
| 6,953,255 | B2 | 10/2005 | Horiuchi et al. |
| 6,953,952 | B2 | 10/2005 | Asakawa |
| 6,956,243 | B1 | 10/2005 | Chin |
| 6,960,878 | B2 | 11/2005 | Sakano et al. |
| 6,969,204 | B2 | 11/2005 | Kilian |
| 6,984,852 | B2 | 1/2006 | Wang et al. |
| 6,995,029 | B2 | 2/2006 | Sorg et al. |
| 6,995,510 | B2 | 2/2006 | Murakami et al. |
| 7,012,277 | B2 | 3/2006 | Takenaka |
| 7,019,334 | B2 | 3/2006 | Yatsuda et al. |
| 7,019,335 | B2 | 3/2006 | Suenaga |
| 7,023,019 | B2 | 4/2006 | Maeda et al. |
| 7,025,651 | B2 | 4/2006 | Song et al. |
| 7,026,756 | B2 | 4/2006 | Shimizu et al. |
| 7,029,935 | B2 | 4/2006 | Negley et al. |
| 7,030,423 | B2 | 4/2006 | Chang et al. |
| 7,038,195 | B2 | 5/2006 | Kida et al. |
| 7,042,021 | B2 | 5/2006 | Isoda |
| 7,045,824 | B2 | 5/2006 | Malone et al. |
| 7,045,826 | B2 | 5/2006 | Kim et al. |
| 7,045,905 | B2 | 5/2006 | Nakashima |
| 7,053,414 | B2 | 5/2006 | Su et al. |
| 7,055,987 | B2 | 6/2006 | Staufert |
| 7,056,772 | B2 | 6/2006 | Shiobara et al. |
| 7,064,424 | B2 | 6/2006 | Wilson |
| 7,066,626 | B2 | 6/2006 | Omata |
| 7,067,848 | B1 | 6/2006 | Lee et al. |
| 7,067,893 | B2 | 6/2006 | Mills et al. |
| 7,070,304 | B2 | 7/2006 | Imai |
| 7,071,493 | B2 | 7/2006 | Owen et al. |
| 7,075,114 | B2 | 7/2006 | Abe et al. |
| 7,075,118 | B2 | 7/2006 | Seki |
| 7,078,253 | B2 | 7/2006 | Brunner et al. |
| 7,078,728 | B2 | 7/2006 | Ishii et al. |
| 7,078,732 | B1 | 7/2006 | Reeh et al. |
| 7,078,734 | B2 | 7/2006 | Hiramoto |
| 7,081,645 | B2 | 7/2006 | Chen et al. |
| 7,084,435 | B2 | 8/2006 | Sugimoto et al. |
| 7,087,937 | B2 | 8/2006 | Liu |
| 7,094,619 | B2 | 8/2006 | Komoto et al. |
| 7,095,053 | B2 | 8/2006 | Mazzochette et al. |
| 7,098,483 | B2 | 8/2006 | Mazzochette et al. |
| 7,098,485 | B2 | 8/2006 | Isokawa |
| 7,102,213 | B2 | 9/2006 | Sorg |
| 7,105,862 | B2 | 9/2006 | Waitl et al. |
| 7,108,386 | B2 | 9/2006 | Jacobson et al. |
| 7,115,911 | B2 | 10/2006 | Chang et al. |
| 7,115,979 | B2 | 10/2006 | Park et al. |
| 7,119,422 | B2 | 10/2006 | Chin |
| 7,126,273 | B2 | 10/2006 | Sorg |
| 7,128,444 | B2 | 10/2006 | Isokawa et al. |
| 7,129,638 | B2 | 10/2006 | Ng |
| 7,135,714 | B2 | 11/2006 | Okazaki et al. |
| 7,138,301 | B2 | 11/2006 | Waitl et al. |
| 7,138,660 | B2 | 11/2006 | Ota et al. |
| 7,138,662 | B2 | 11/2006 | Uemura |
| 7,138,664 | B2 | 11/2006 | Okazaki et al. |
| 7,138,667 | B2 | 11/2006 | Barnett et al. |
| 7,145,182 | B2 | 12/2006 | Peh |
| 7,157,746 | B2 | 1/2007 | Ota et al. |
| 7,161,190 | B2 | 1/2007 | Chikugawa |
| 7,165,896 | B2 | 1/2007 | Hauffe et al. |
| 7,166,868 | B2 | 1/2007 | Wu |
| 7,166,873 | B2 | 1/2007 | Okazaki |
| 7,170,099 | B2 | 1/2007 | Noguchi |
| 7,170,101 | B2 | 1/2007 | Tatsumi et al. |
| 7,173,311 | B2 | 2/2007 | Sato et al. |
| 7,176,473 | B2 | 2/2007 | Aki et al. |
| 7,176,501 | B2 | 2/2007 | Lee et al. |
| 7,176,502 | B2 | 2/2007 | Mazzochette et al. |
| 7,176,612 | B2 | 2/2007 | Omoto et al. |
| 7,176,623 | B2 | 2/2007 | Nitta et al. |
| 7,180,240 | B2 | 2/2007 | Noguchi et al. |
| 7,183,587 | B2 | 2/2007 | Negley et al. |
| 7,183,588 | B2 | 2/2007 | Chia et al. |
| 7,183,632 | B2 | 2/2007 | Arndt |
| 7,183,661 | B2 | 2/2007 | Bogner et al. |
| 7,184,111 | B2 | 2/2007 | Chua et al. |
| 7,187,009 | B2 | 3/2007 | Fukasawa et al. |
| 7,187,010 | B2 | 3/2007 | Tsukagoshi |
| 7,188,985 | B2 | 3/2007 | Ishida |
| 7,190,003 | B2 | 3/2007 | Isoda |
| 7,192,163 | B2 | 3/2007 | Park |
| 7,192,795 | B2 | 3/2007 | Boardman et al. |
| 7,196,358 | B1 | 3/2007 | Chen |
| 7,196,359 | B2 | 3/2007 | Baur et al. |
| 7,199,400 | B2 | 4/2007 | Sasuga |
| 7,199,454 | B2 | 4/2007 | Arndt et al. |
| 7,199,470 | B2 | 4/2007 | Bogner et al. |
| 7,201,495 | B2 | 4/2007 | Epstein |
| 7,202,507 | B2 | 4/2007 | Isokawa |
| 7,205,575 | B2 | 4/2007 | Chin et al. |
| 7,205,579 | B2 | 4/2007 | Wu |
| 7,205,648 | B2 | 4/2007 | Shei et al. |
| 7,208,738 | B2 | 4/2007 | Yoganandan et al. |
| 7,208,772 | B2 | 4/2007 | Lee et al. |
| 7,210,807 | B2 | 5/2007 | Sakamoto et al. |
| 7,210,834 | B2 | 5/2007 | Sazuka et al. |
| 7,223,620 | B2 | 5/2007 | Jager et al. |
| 7,224,001 | B2 | 5/2007 | Cao |
| 7,227,194 | B2 | 6/2007 | Ono |
| 7,227,195 | B2 | 6/2007 | Takahashi et al. |
| 7,230,259 | B2 | 6/2007 | Inoue et al. |
| 7,233,106 | B2 | 6/2007 | Lee et al. |
| 7,235,189 | B2 | 6/2007 | Hohn et al. |
| 7,238,967 | B2 | 7/2007 | Kuwabara et al. |
| 7,242,030 | B2 | 7/2007 | Wang et al. |
| 7,244,924 | B2 | 7/2007 | Kiyomoto et al. |
| 7,244,965 | B2 | 7/2007 | Andrews et al. |
| 7,247,940 | B2 | 7/2007 | Hofer et al. |
| 7,253,448 | B2 | 8/2007 | Roberts et al. |
| 7,253,449 | B2 | 8/2007 | Wu |
| 7,256,428 | B2 | 8/2007 | Braune et al. |
| 7,259,400 | B1 | 8/2007 | Taskar |
| 7,259,401 | B2 | 8/2007 | Wong et al. |
| 7,259,403 | B2 | 8/2007 | Shimizu et al. |
| 7,260,123 | B2 | 8/2007 | Sato |
| 7,261,441 | B2 | 8/2007 | Ng et al. |
| 7,262,438 | B2 | 8/2007 | Mok et al. |
| 7,264,381 | B2 | 9/2007 | Liu et al. |
| 7,265,392 | B2 | 9/2007 | Hahn et al. |
| 7,267,791 | B2 | 9/2007 | Ricking et al. |
| 7,268,010 | B2 | 9/2007 | Song |
| 7,268,014 | B2 | 9/2007 | Lee et al. |
| 7,268,370 | B2 | 9/2007 | Ueda |
| 7,271,423 | B2 | 9/2007 | Hanamoto et al. |
| 7,276,736 | B2 | 10/2007 | Hohn et al. |
| 7,276,739 | B2 | 10/2007 | Chen et al. |
| 7,276,741 | B2 | 10/2007 | Wu |
| 7,276,782 | B2 | 10/2007 | Wang et al. |
| 7,279,346 | B2 | 10/2007 | Andrews et al. |
| 7,279,716 | B2 | 10/2007 | Chen |
| 7,279,718 | B2 | 10/2007 | Krames et al. |
| 7,279,719 | B2 | 10/2007 | Suehiro et al. |
| 7,279,723 | B2 | 10/2007 | Matsumura et al. |
| 7,282,740 | B2 | 10/2007 | Chikugawa et al. |
| 7,282,747 | B2 | 10/2007 | Takeda et al. |
| 7,282,748 | B2 | 10/2007 | Takeda et al. |
| 7,282,785 | B2 | 10/2007 | Yoshida |
| 7,285,802 | B2 | 10/2007 | Ouderkirk et al. |
| 7,285,803 | B2 | 10/2007 | Kato et al. |
| 7,288,795 | B2 | 10/2007 | Komoto et al. |
| 7,288,797 | B2 | 10/2007 | Deguchi et al. |
| 7,288,798 | B2 | 10/2007 | Chang et al. |

| | | | |
|---|---|---|---|
| 7,291,866 B2 | 11/2007 | Oshio et al. | |
| 7,293,889 B2 | 11/2007 | Kamiya et al. | |
| 7,293,908 B2 | 11/2007 | Beeson et al. | |
| 7,294,861 B2 | 11/2007 | Schardt et al. | |
| 7,296,916 B2 | 11/2007 | Ouderkirk et al. | |
| 7,300,182 B2 | 11/2007 | Mazzochette | |
| 7,300,326 B2 | 11/2007 | Tanaka et al. | |
| 7,301,175 B2 | 11/2007 | Izuno et al. | |
| 7,301,176 B2 | 11/2007 | Abe et al. | |
| 7,303,315 B2 | 12/2007 | Ouderkirk et al. | |
| 7,303,932 B2 | 12/2007 | Sakano | |
| 7,304,326 B2 | 12/2007 | Suehiro et al. | |
| 7,304,418 B2 | 12/2007 | Nagata et al. | |
| 7,307,285 B2 | 12/2007 | Noguchi | |
| 7,307,286 B2 | 12/2007 | Ito et al. | |
| 7,309,151 B2 | 12/2007 | Mok et al. | |
| 7,309,881 B2 | 12/2007 | Sato et al. | |
| 7,312,477 B2 | 12/2007 | Yatsuda et al. | |
| 7,314,770 B2 | 1/2008 | Boardman et al. | |
| 7,315,046 B2 | 1/2008 | Komoto et al. | |
| 7,315,048 B2 | 1/2008 | Fung et al. | |
| 7,317,181 B2 | 1/2008 | Murakami et al. | |
| 7,319,245 B2 | 1/2008 | Brunner et al. | |
| 7,319,289 B2 | 1/2008 | Suehiro et al. | |
| 7,326,583 B2 | 2/2008 | Andrews et al. | |
| 7,329,904 B2 | 2/2008 | Nawashiro et al. | |
| 7,329,905 B2 | 2/2008 | Ibbetson et al. | |
| 7,329,907 B2 | 2/2008 | Pang et al. | |
| 7,332,747 B2 | 2/2008 | Uemura et al. | |
| 7,332,802 B2 | 2/2008 | Konno | |
| 7,332,862 B2 | 2/2008 | Tsukamoto et al. | |
| 7,334,919 B2 | 2/2008 | Wu | |
| 7,335,925 B2 | 2/2008 | Ishidu et al. | |
| 7,335,926 B2 | 2/2008 | Wang et al. | |
| 7,338,823 B2 | 3/2008 | Han et al. | |
| 7,342,255 B2 | 3/2008 | Lin et al. | |
| 7,342,257 B2 | 3/2008 | Oomori | |
| 7,342,260 B2 | 3/2008 | Chen et al. | |
| 7,342,261 B2 | 3/2008 | Wuu et al. | |
| 7,342,357 B2 | 3/2008 | Sakano et al. | |
| 7,345,322 B2 | 3/2008 | Kikuchi | |
| 7,347,603 B2 | 3/2008 | Ikeda et al. | |
| 7,351,918 B2 | 4/2008 | Nakai | |
| 7,352,011 B2 | 4/2008 | Smits et al. | |
| 7,355,284 B2 | 4/2008 | Negley | |
| 7,358,109 B2 | 4/2008 | Gallup et al. | |
| 7,358,535 B2 | 4/2008 | Shoji et al. | |
| 7,358,543 B2 | 4/2008 | Chua et al. | |
| 7,361,940 B2 | 4/2008 | Kim et al. | |
| 7,365,407 B2 | 4/2008 | Ng et al. | |
| 7,368,329 B2 | 5/2008 | Waitl et al. | |
| 7,371,603 B2 | 5/2008 | Kim et al. | |
| 7,375,381 B2 | 5/2008 | Shimizu et al. | |
| 7,378,647 B2 | 5/2008 | Nishikawa et al. | |
| 7,381,996 B2 | 6/2008 | Hsin Chen | |
| 7,382,091 B2 | 6/2008 | Chen et al. | |
| 7,384,153 B2 | 6/2008 | Nakamura | |
| 7,385,227 B2 | 6/2008 | Mok et al. | |
| 7,385,285 B2 | 6/2008 | Wang | |
| 7,390,129 B2 | 6/2008 | Yonekubo et al. | |
| 7,391,153 B2 | 6/2008 | Suehiro et al. | |
| 7,394,108 B2 | 7/2008 | Takeda et al. | |
| 7,402,842 B2 | 7/2008 | Goodrich | |
| 7,405,093 B2 | 7/2008 | Andrews | |
| 7,407,312 B2 | 8/2008 | Lee | |
| 7,411,222 B2 | 8/2008 | Kinoshita et al. | |
| 7,411,224 B2 | 8/2008 | Kim et al. | |
| 7,411,225 B2 | 8/2008 | Kim et al. | |
| 7,414,269 B2 | 8/2008 | Grotsch et al. | |
| 7,414,270 B2 | 8/2008 | Kim et al. | |
| 7,414,272 B2 | 8/2008 | Hiramatsu et al. | |
| 7,416,906 B2 | 8/2008 | Tasaki et al. | |
| 7,417,260 B2 | 8/2008 | Wuu et al. | |
| 7,420,754 B2 | 9/2008 | Nagasaka | |
| 7,422,504 B2 | 9/2008 | Maeda et al. | |
| 7,425,083 B2 | 9/2008 | Kim et al. | |
| 7,425,459 B2 | 9/2008 | Nagai et al. | |
| 7,427,523 B2 * | 9/2008 | Boardman et al. | 438/22 |
| 7,427,784 B2 | 9/2008 | Liu et al. | |
| 7,429,759 B2 | 9/2008 | Isokawa | |
| 7,435,997 B2 | 10/2008 | Arndt et al. | |
| 7,436,000 B2 | 10/2008 | Kim et al. | |
| 7,442,562 B2 | 10/2008 | Onishi et al. | |
| 7,442,563 B2 | 10/2008 | Harada | |
| 7,442,564 B2 | 10/2008 | Andrews | |
| 7,445,354 B2 | 11/2008 | Aoki et al. | |
| 7,456,499 B2 | 11/2008 | Loh et al. | |
| 7,458,703 B2 | 12/2008 | Han et al. | |
| 7,482,696 B2 | 1/2009 | Shei et al. | |
| 7,838,897 B2 * | 11/2010 | Higashi et al. | 257/99 |
| 2002/0113245 A1 | 8/2002 | Lin | |
| 2004/0120155 A1 | 6/2004 | Suenaga | |
| 2005/0121686 A1 * | 6/2005 | Keller et al. | 257/99 |
| 2005/0189555 A1 | 9/2005 | Lin et al. | |
| 2005/0269688 A1 | 12/2005 | Shiv | |
| 2005/0274959 A1 | 12/2005 | Kim et al. | |
| 2006/0001055 A1 | 1/2006 | Ueno et al. | |
| 2006/0027826 A1 * | 2/2006 | Goodrich | 257/99 |
| 2006/0163596 A1 | 7/2006 | Kim et al. | |
| 2006/0183625 A1 | 8/2006 | Miyahara | |
| 2006/0220036 A1 * | 10/2006 | Lee et al. | 257/81 |
| 2009/0261375 A1 * | 10/2009 | Chen et al. | 257/99 |
| 2009/0273002 A1 * | 11/2009 | Chiou et al. | 257/99 |
| 2009/0273005 A1 * | 11/2009 | Lin | 257/99 |
| 2009/0321778 A1 * | 12/2009 | Chen et al. | 257/99 |
| 2010/0001305 A1 * | 1/2010 | Lin et al. | 257/99 |
| 2010/0213498 A1 * | 8/2010 | Kim | 257/99 |

FOREIGN PATENT DOCUMENTS

| | | |
|---|---|---|
| EP | 1 179 858 | 2/2002 |
| EP | 1 605 523 | 12/2005 |
| EP | 1 848 042 | 10/2007 |
| JP | 11251644 | 9/1999 |
| JP | 2001-15815 | 1/2001 |
| JP | 2006-59924 | 3/2006 |
| WO | WO 2007/121973 | 11/2007 |

* cited by examiner

US 8,044,412 B2

PACKAGE FOR A LIGHT EMITTING ELEMENT

CROSS-REFERENCE TO RELATED APPLICATIONS

This application is a continuation-in-part application of and claims priority to U.S. application Ser. No. 11/336,094, filed on Jan. 20, 2006, the entire contents of which are hereby incorporated herein by reference.

TECHNICAL FIELD

This disclosure relates to a package for a light emitting device such as a light emitting diode.

BACKGROUND

Reduction in light emitting diode (LED) package size is an important factor in the design of various portable display technologies requiring compact design such as cell phones or handheld computers. Traditionally, LED's are housed in packages that include multiple components which occupy an area much larger than the LED chip itself.

High brightness (HB) LED chips are being operated at ever-increasing power levels. Generally, the light conversion efficiency of LED chips is fairly low such that heat generated by the LED chip has to be removed by the package to the surroundings.

It is common that the combination of the LED substrate, the submount and the package material are poorly suited for transferring heat from the LED chip to the surroundings. Highly thermally conductive material such as metal mounts cannot be used alone because the electrical contacts to the LED must be electrically isolated. While those contacts can be isolated, the necessary materials usually create a decrease in the thermal conductivity that limits the physical size and power of the chips that can be used in the package.

SUMMARY

Various aspects of the invention are recited in the claims. In one aspect, a high-brightness LED module includes a substrate (also referred to as submount or platform) with a recess in which a light emitting element is mounted. The recess is defined by sidewalls and a membrane. At least two through-holes filled with electrically conducting material (also referred to as micro-vias or through-contacts) are disposed in the membrane to electrically connect the light emitting element to the exterior of the package.

DETAILED DESCRIPTION

I. First Implementation

Figure 1:
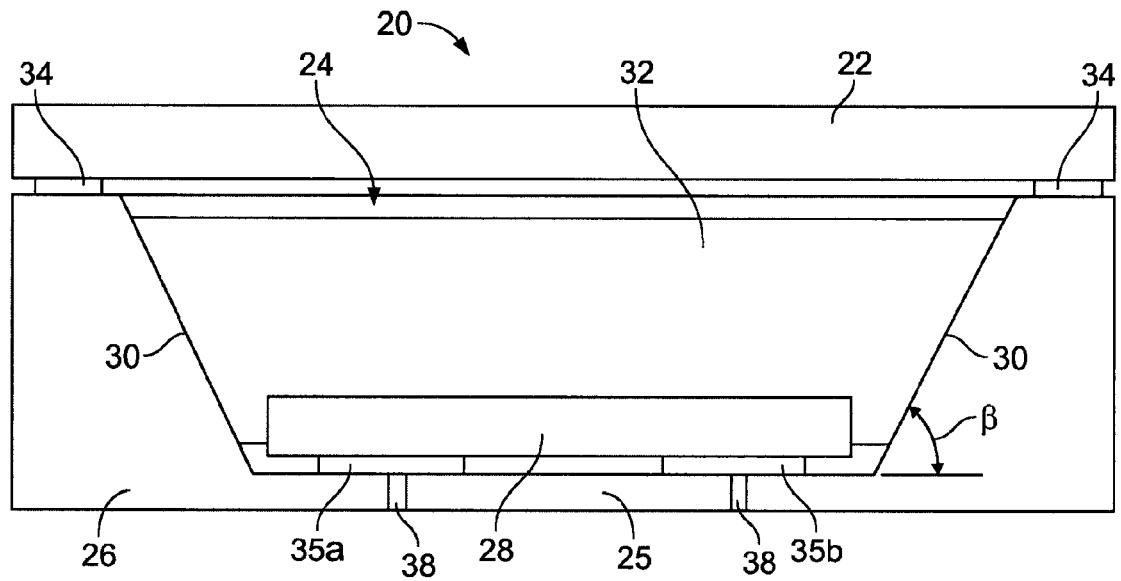
FIG. 1 illustrates a cross-sectional view of an example of an optical package.

As shown in FIG. 1, a package 20 includes a lid 22, a recess 24 and a substrate 26. One or more opto-electronic devices (light emitting or receiving) may be mounted in the recess 24 between the substrate 26 and lid 22. In this particular implementation, the opto-electronic device is a light emitting diode (LED) 28.

The substrate 26 may comprise, for example, a semiconductor material such as silicon (Si), so that the recess 24 may be formed by known etching processes. Anisotropic wet etching solutions such as aqueous potassium hydroxide may be used to form slanted sidewalls 30. In the implementation of FIG. 1, at least one of the sidewalls 30 of the recess 24 is slanted at an angle β of about 54.7°. The angle of the sidewalls 30 may differ in other implementations. For dry etching techniques, such as reactive ion etching, vertical sidewalls can be achieved. The etching process leaves a thin membrane 25 of silicon on which the LED 28 is supported. The sidewalls 30 may be coated with a material, such as metal, which acts as a reflecting surface 32 (see FIG. 2) to redirect light exiting from the side walls of the LED 28 towards the lid 22.

Figure 2:
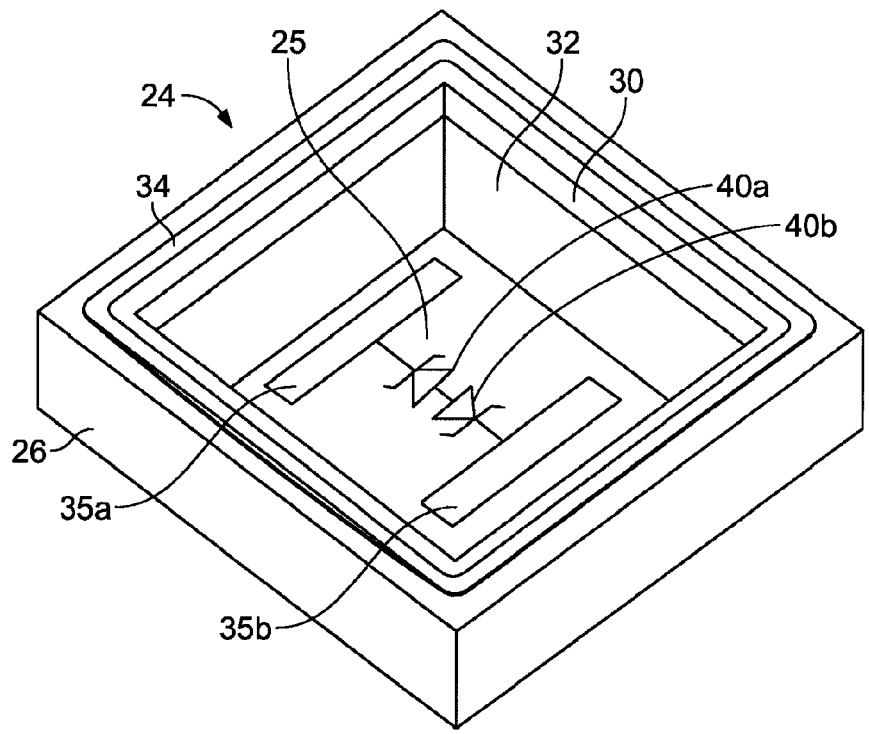
FIGS. 2-4 illustrate various details of the package of FIG. 1.
Figure 3:
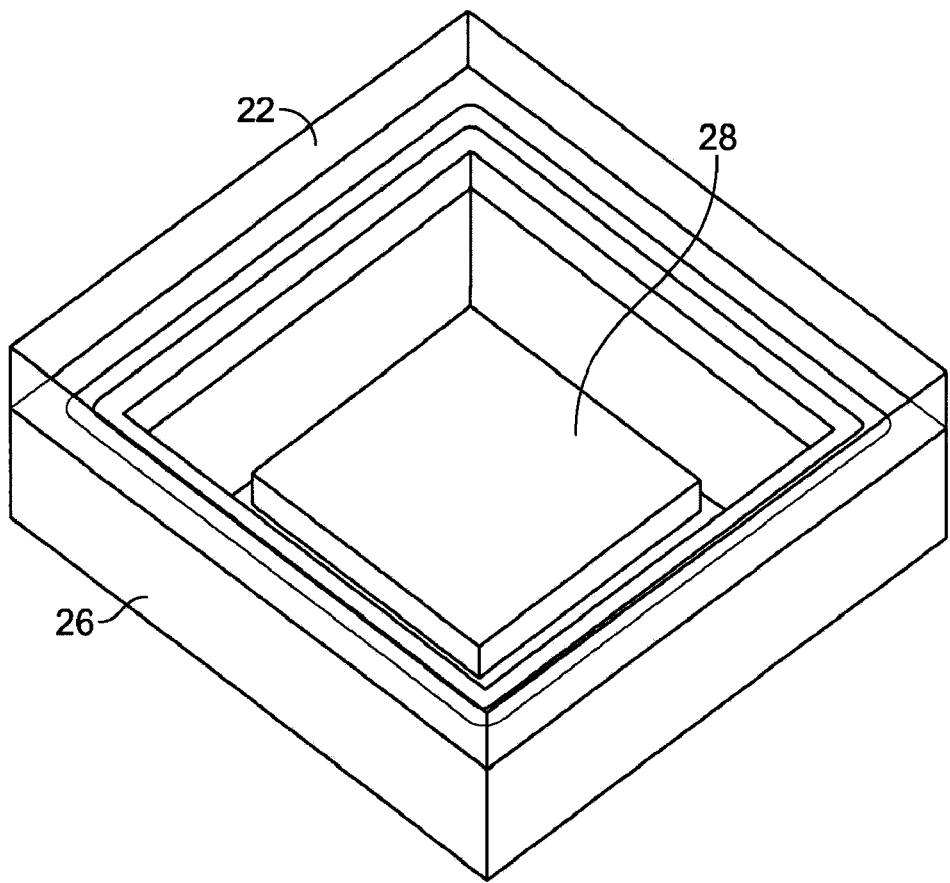

The lid 22 can comprise a material such as glass or silicon that is transparent to at least a specified wavelength of light (or a band of wavelength) emitted by the LED 28. In some implementations, the lid 22 is positioned over and covers the entire recess 24 (see FIG. 3). As shown in FIG. 2, a metal ring 34, which circumscribes the recess 24 may be formed on the surface of the substrate 26. A hermetic seal may be formed when the lid 22, which is positioned over the entire recess 24, is fused to the metal ring 34 using, for example, a solder reflow process or a thermo-compression bonding process. Other sealing techniques that do not require a metal seal ring 34 can be used as well, such as anodic bonding, glass frit bonding or epoxy bonding.

Figure 4:
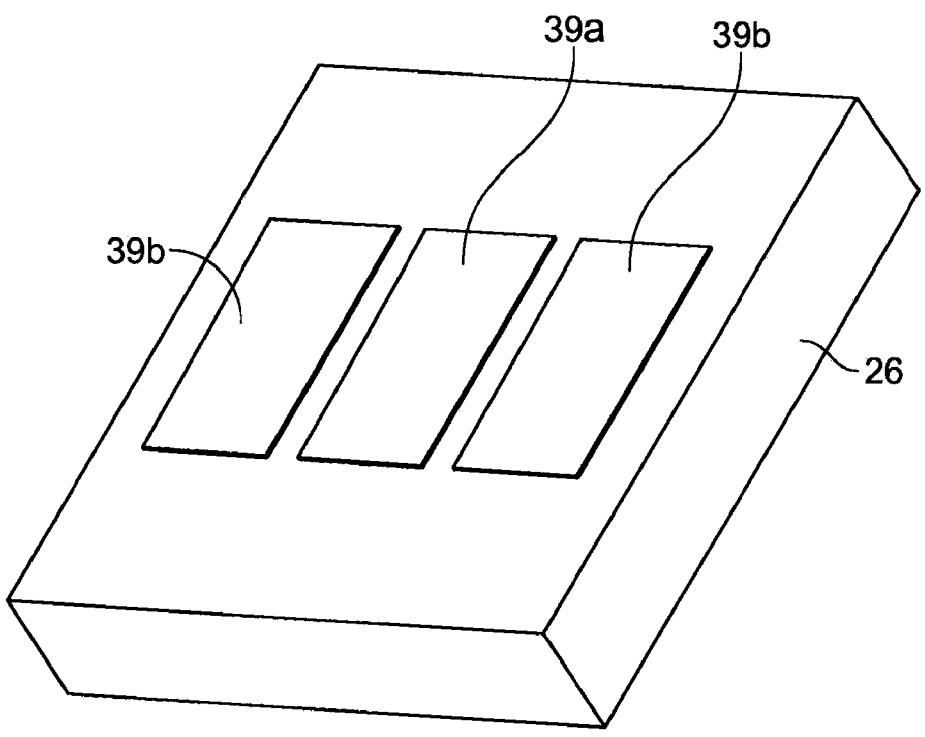

The LED 28 can be mounted in the recess 24, for example, by solder (e.g., eutectic AuSn metallurgy) or adhesive die attach techniques (using, e.g., either conductive or non-conductive adhesive). Wire bonds can be used to electrically connect contacts of the LED and micro-vias via bond pads 35a, 35b, which are deposited and patterned at the bottom of the recess 24 (see FIGS. 1-2). Preferably, the bond pads 35a, 35b comprise an electrically conducting material such as metal. As shown in FIG. 1, the bond pads 35a, 35b can be provided on a portion of the surface of thin silicon membrane 25 which includes electrically conductive feed-through material 38 formed in the thin silicon membrane 25. The electrically conductive feed-through material 38 provides electrical contact from the LED 28 and bond pads 35a, 35b through substrate 26 to the package exterior. The conductive feed-through material 38 may be provided, for example, using an electroplated feed-through metallization process and allows the LED 28 to remain sealed hermetically within the package. Other deposition techniques, such as physical vapor deposition (PVD) or chemical vapor deposition (CVD) may be used as well. In a particular implementation, hermetically sealing the through-holes includes providing a sandwiched stack of different materials, such as an adhesion layer, a plating base, a feed-through metallization, a diffusion barrier, a wetting layer, and an anti-oxidation barrier that comprises, for example, a noble metal. In applications where improved heat transfer between the package and an external support is desired, metal pads 39a may be provided on the package exterior on a side opposite the recess 24 (see FIG. 4). Additionally, metal pads 39b may cover and electrically connect to conductive feed-through material 38 as well as provide improved heat transfer to an external support. Metal pads 39b may be used as under-bump metallization (UBM) for solder interconnects to printed circuit boards (PCBs).

Figure 5:
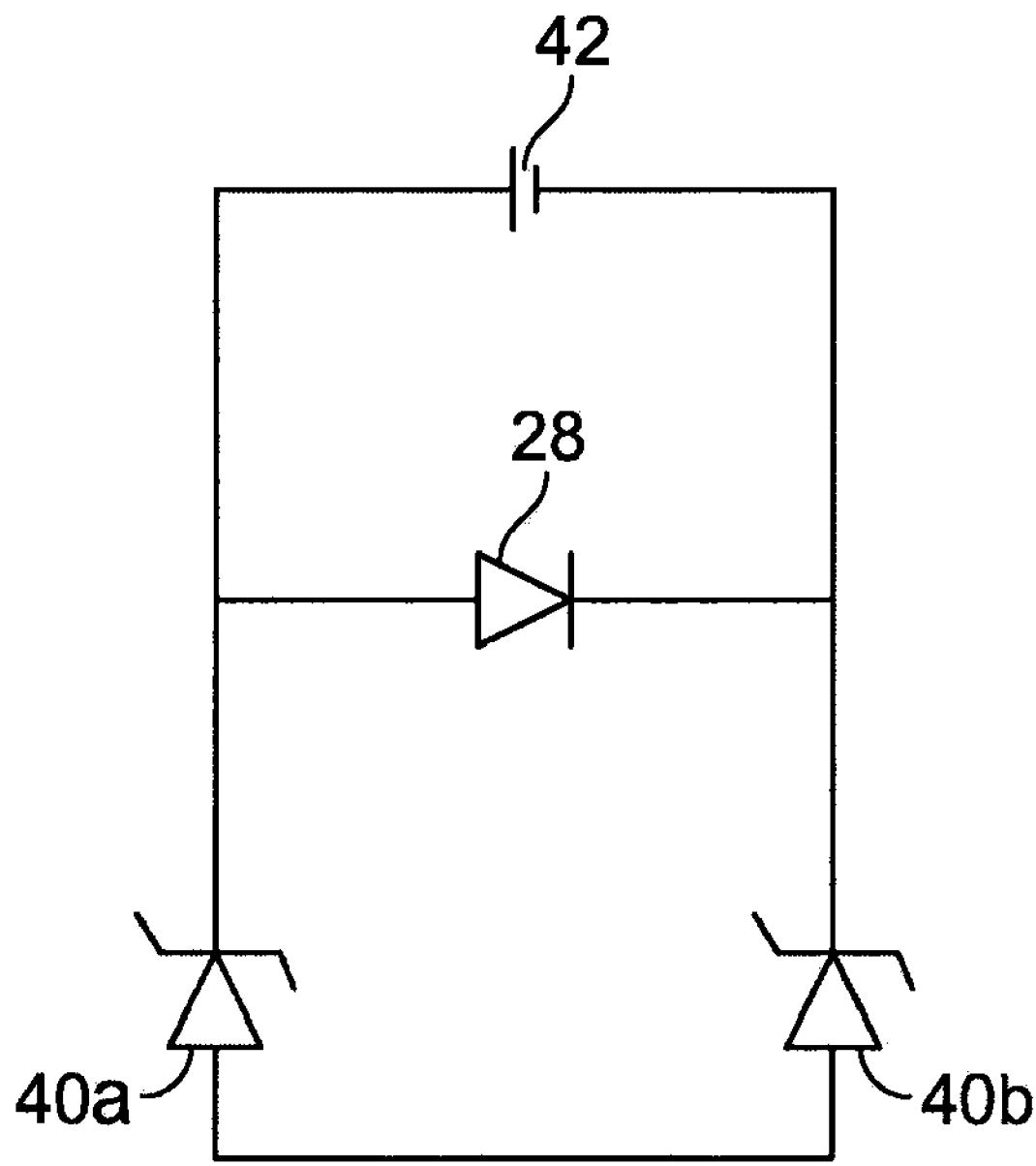
FIG. 5 illustrates a circuit schematic of the LED and electrostatic discharge (ESD) circuitry.

To provide protection from damage to the LED 28 that may occur as a result of excess electrical charge, electrostatic discharge (ESD) protection circuitry 40 can be formed in the thin membrane 25 region of the substrate 26 (see FIG. 2), for example, but not limited to, by a phosphorous and boron diffusion process. Preferably, the ESD circuitry 40 is connected in parallel with the LED 28 through the bond pads 35a, 35b. In the present implementation, for example, the ESD circuitry 40 comprises two zener diodes 40a, 40b configured back-to-back. FIG. 5 shows a circuit schematic of the ESD circuitry connected to the LED 28 and an external voltage supply 42. When excess electrical charge creates a voltage (V) across the LED 28 that exceeds a threshold voltage, the ESD circuitry 40 clamps the voltage (V) to a clamp voltage and diverts a current ($I_s$) from the LED 28. The threshold voltage and clamp voltage are determined by the breakdown voltages of the zener diodes under reverse bias and the threshold voltages of the zener diodes under forward bias.

II. Second Implementation

Figure 6A:
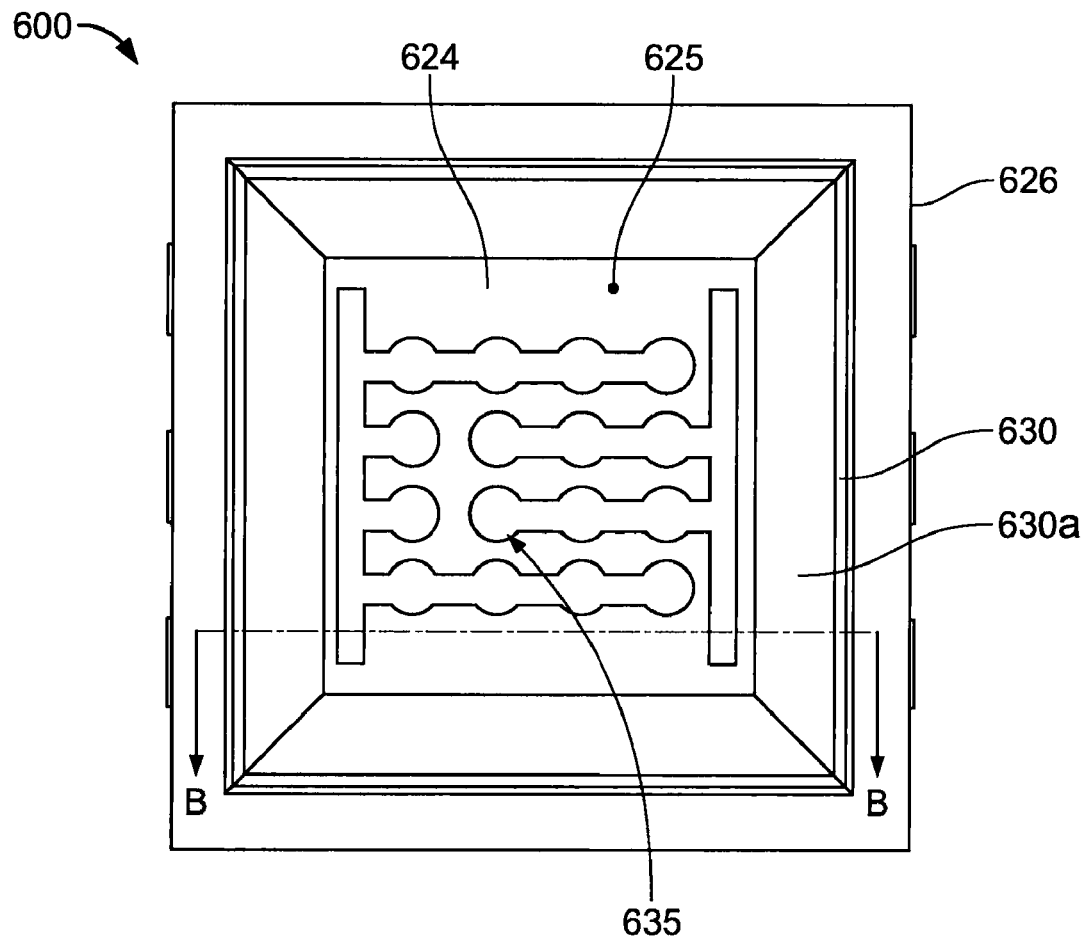
FIGS. 6A-6F illustrate various details of another example of an optical package.

FIG. 6A illustrates a second implementation of an LED package 600. The package 600, which includes substrate 626 and thin membrane 625, is in some implementations formed of silicon. The thermal conductivity of silicon is relatively high and the native silicon oxide can be used as an electrical isolator. Alternatively, thicker silicon oxide isolators can be obtained by thermal oxidation techniques. Also, silicon allows the use of surface mount technology (SMT), which is facilitated by micro-via technology. Silicon also allows wafer-level processing of the LED die attachment, testing and lens attachment (see, e.g., FIGS. 8A-8B). In instances in which the LED used in conjunction with the LED package comprises a silicon substrate, silicon is advantageously used for the package material because compatibility of thermal properties (e.g., the coefficient of thermal expansion) of the LED and the LED package are desirable. For example, it can be advantageous for the substrate and the LED to have similar coefficients of thermal expansion.

The package 600 includes a recess 624 defined by sidewalls 630 and membrane 625. Sidewalls 630 can be metallized to form a reflective coating 630a. Metallization of the sidewalls increases reflectivity and the light output of an LED that is mounted in the recess 624. While metals such as aluminum, silver or gold can be used to provide the reflective coating 630a, other reflective materials are suitable (including non-metals). To preserve reflectance over time, the reflective coating 630a can also include a protective coating such as, but not limited to, titanium oxide or silicon oxide. A protective coating may also comprise a variety of layers in a sandwich configuration, such as, but not limited to, silver-chromium compound, chromium, silicon oxide and silicon nitride. Also, in implementations for which it is desirable to scatter rather than reflect light from the coating 630a, the reflective coating 630a can be roughened or textured. Alternatively, the protective coating can be roughened or textured. Scattered light from the coating 630a would hit a lid 22 in shallow angles and reduce total internal reflection (TIR).

Bond pads 635 are disposed on the membrane 625. The bond pads 635, which can include a metal surface and solder, such as, but not limited to, eutectic AuSn solder, are arranged in a manner that corresponds with the contacts of associated LED chip that will be mounted thereto. The bond pads 635 cover a significant amount of the membrane, which can be advantageous for several reasons, including: (1) increased heat transfer from the LED chip to the package 600 (e.g., as a result of the high thermal conductivity of the bond pads 635) and (2) distributing the contacts across the LED surface generally increases the efficiency of the LED. Bond pads 635 are appropriate for use with, e.g., a flip-chip LED.

Figure 6B:
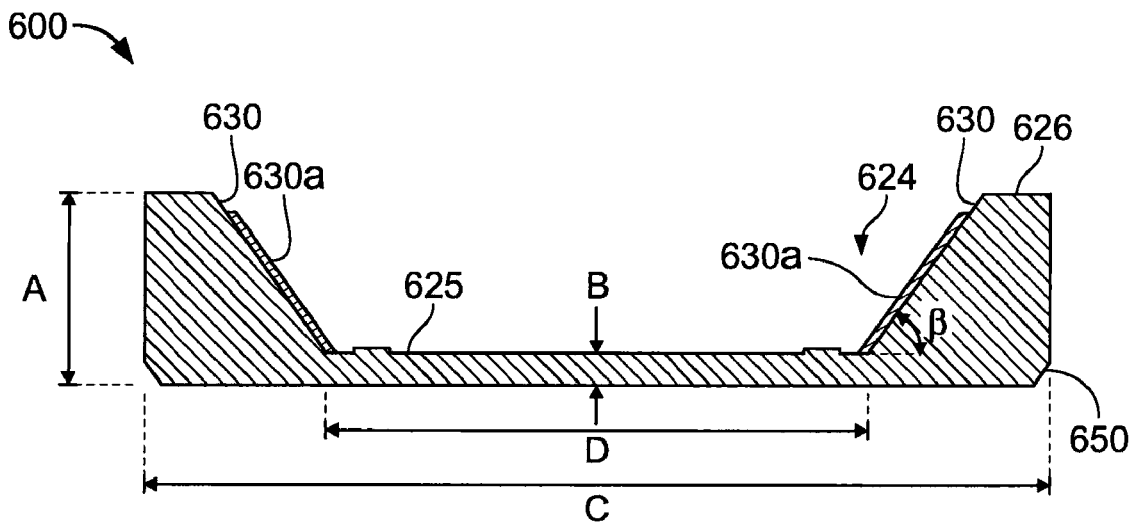

FIG. 6B is a cross-sectional view of package 600 taken through line B-B of FIG. 6A. As the package 600 can comprise, for example, a semiconductor material such as silicon, the recess 624 can be formed by known etching processes. Anisotropic wet etching solutions such as aqueous potassium hydroxide can be used to form the slanted sidewalls 630. Depending on the implementation, at least one of the sidewalls 630 of the recess 624 can be slanted at an angle ($\beta$) of about 54.7 degrees. The angle of the sidewalls 630 may differ in other implementations. For dry etching techniques, such as reactive ion etching, vertical sidewalls can be achieved.

The cross-sectional view illustrates that the portion of the substrate 626 that is thickest (i.e., measured by dimension A) forms a frame around the recess 624.

The etching process leaves a relatively thin membrane 625 on which an LED can be supported. Depending on the implementation, dimension A (i.e., the thickness of the frame portion of substrate 626) is between about 100 and 700 microns (μm) and dimension B (i.e., the thickness of the membrane 625) is between about 40 and 150 microns. For example, in one implementation, dimension A is about 400 microns and dimension B is about 60 microns. In another implementation, dimension A is between about 100 and 300 microns and dimension B is between about 40 and 80 microns. In another implementation, dimension A is about 410 microns and dimension B is about 55 microns. In another implementation, dimension A is about 410 microns and dimension B is about 60 microns. In another implementation, dimension A is about 650 micrometers and dimension B is about 150 micrometers. In another implementation, dimension A is between about 100 and 200 microns and dimension B is between about 40 and 80 microns. In some implementations, dimension A is more than 6 times larger than dimension B. In some implementations, the maximum of dimension A is between about 200 and 410 microns.

For example, in an implementation where dimension A (frame thickness) is about 410 microns and dimension B (membrane thickness) is between about 55 and 60 microns, dimension C (i.e., the width of the package 600) would be about 2 millimeters and dimension D (i.e., the width of the membrane 625) would be about 1.17 millimeters. Such an implementation would be well-suited, e.g., for a 1 millimeter by 1 millimeter LED chip. Therefore, in such an implementation, the thickness of the membrane is less than 3/10 the LED chip dimension, is less than 1/10 the LED chip dimension, and is about 1/18 of the LED chip dimension. In such an implementation, the frame thickness is more than twice that of the membrane, and is almost seven times as thick.

Bevel 650, which can surround the entire package 600 (see, e.g., FIG. 6C) is an etched feature that can facilitate solder inspection after the package 600 is mounted to a PCB. Bevels 650 are fully or partially covered with under-bump metallization (UBM) 639a. During PCB mounting, the solder will form a meniscus shape that can be inspected by top view means.

Figure 6C:
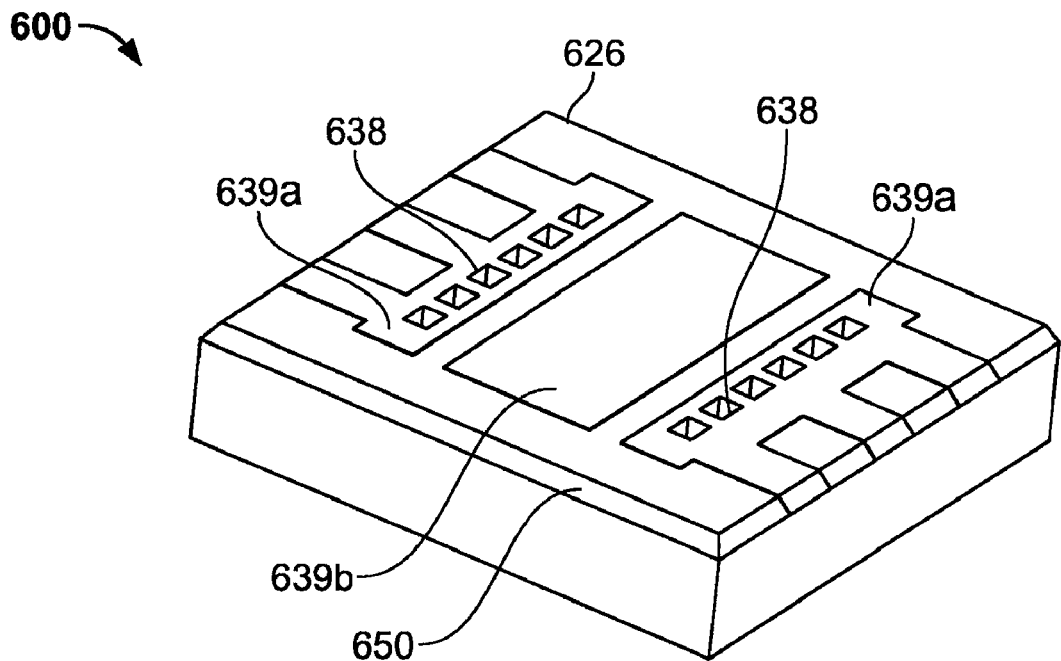
Figure 6D:
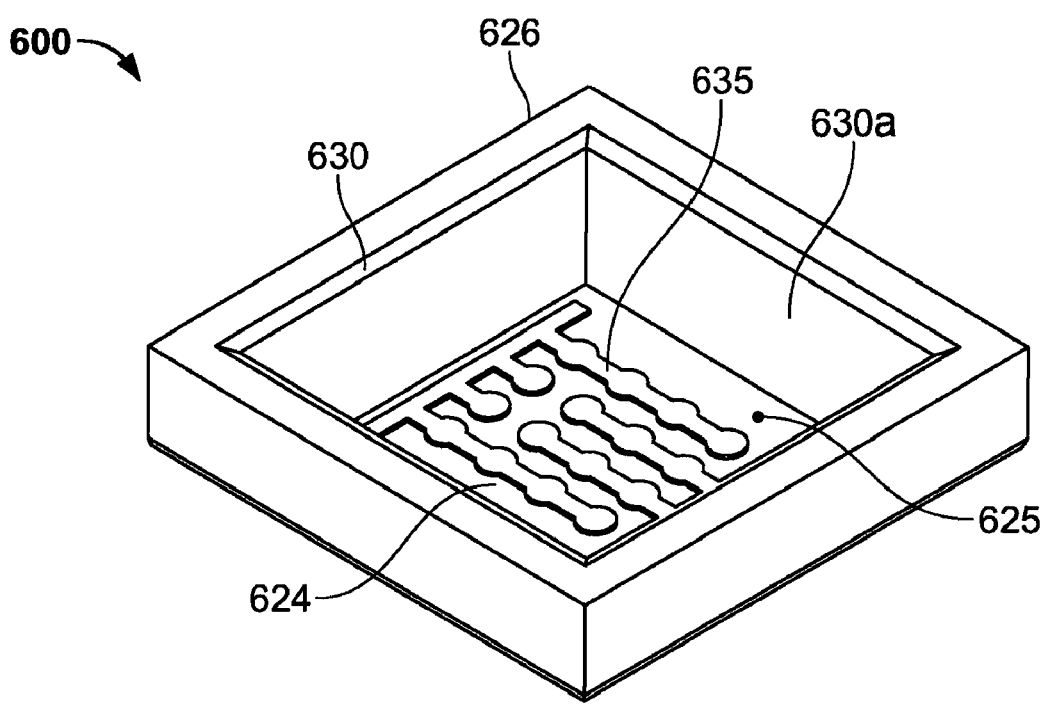

FIGS. 6C and 6D are perspective views of the package 600, illustrating (respectively) bottom and top views thereof. Bond pads 635 (see also FIG. 6A) are provided on a portion of the surface of the membrane 625, which includes electrically conductive through-contacts 638 formed in the thin membrane 625. The electrically conductive through-contacts 638 provide electrical contact from an LED (e.g., item 628 of FIG. 6E) and bond pads 635 through membrane 625 to the package 600 exterior. Bond wires or other electrical connections can be provided to connect the LED to the bond pads 635. The conductive through-contacts 638 may be provided, for example, using an electroplated feed-through metallization process and allow the LED to remain sealed hermetically within the package. Other deposition techniques, such as physical vapor deposition (PVD) or chemical vapor deposition (CVD) may be used as well. The conductive through-contacts 638 also can be formed by doping a portion of the silicon membrane 625. The conductive through-contacts 638 can be micro-vias. Through-contacts 638 can have the shape of holes or planar areas. In some implementations, hermetically sealing the through-holes includes providing a sandwiched stack of different materials, such as, but not limited to, an adhesion layer, a plating base, a feed-through metallization, a diffusion barrier, a wetting layer, and an anti-oxidation barrier that comprises, for example, a noble metal. The through-contacts 638 can be electrically coupled to underbump metallization pads 639a that facilitate electrical connection to the LED mounted within the package 600. Of course, it is generally preferred that the through-contacts associated with the n-contact of the LED be electrically isolated from the through-contacts associated with the p-contact of the LED.

In applications where improved heat transfer between the package 600 and an external support is desired, a metal pad 639b can be provided on the package exterior on a side opposite the recess 624 (see FIG. 6B). The metal pad 639b can be disposed directly opposite the LED such that heat transfer away from the LED is enhanced. The metal pad 639b can be electrically isolated from metal pads 639a, or electrically connected to either of the metal pads 639a. In addition to providing electrical contact, metal pads 639a also can provide improved heat transfer to an external support.

Figure 6E:
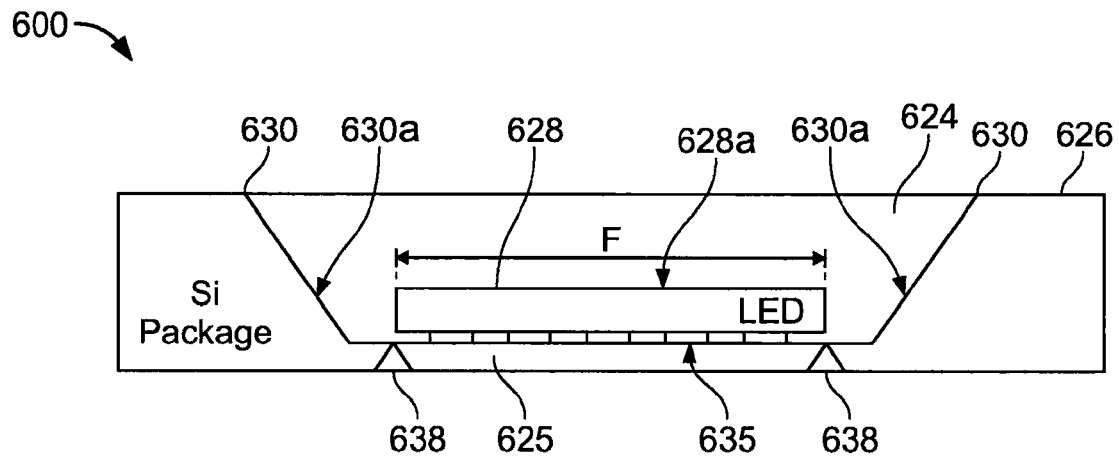

FIG. 6E is a cross-sectional view of package 600 with an LED 628 mounted to the membrane 625. In this illustration, LED 628 is mounted using flip chip techniques and is coupled to the membrane 625 by way of bond pads 635. The LED 628 is mounted to the membrane 625 without using a separate sub-mount. The optically active layer 628a of the LED 628 causes it to emit light horizontally in a direction generally away from the membrane 625.

In the example discussed in connection with FIG. 6B where dimension A is about 410 microns, dimension B is between about 55 and 60 microns, dimension C is about 2 millimeters, and dimension D is about 1.17 millimeters, and dimension E (i.e., the side length of the LED 628) is about 1 millimeter. In some implementations, the LED 628 has an approximately square plan view, such that its width and depth in this perspective would be about equal (see FIG. 6F wherein dimensions E and F are about equal). The LED chip 628 is about 80 microns thick.

Figure 6F:
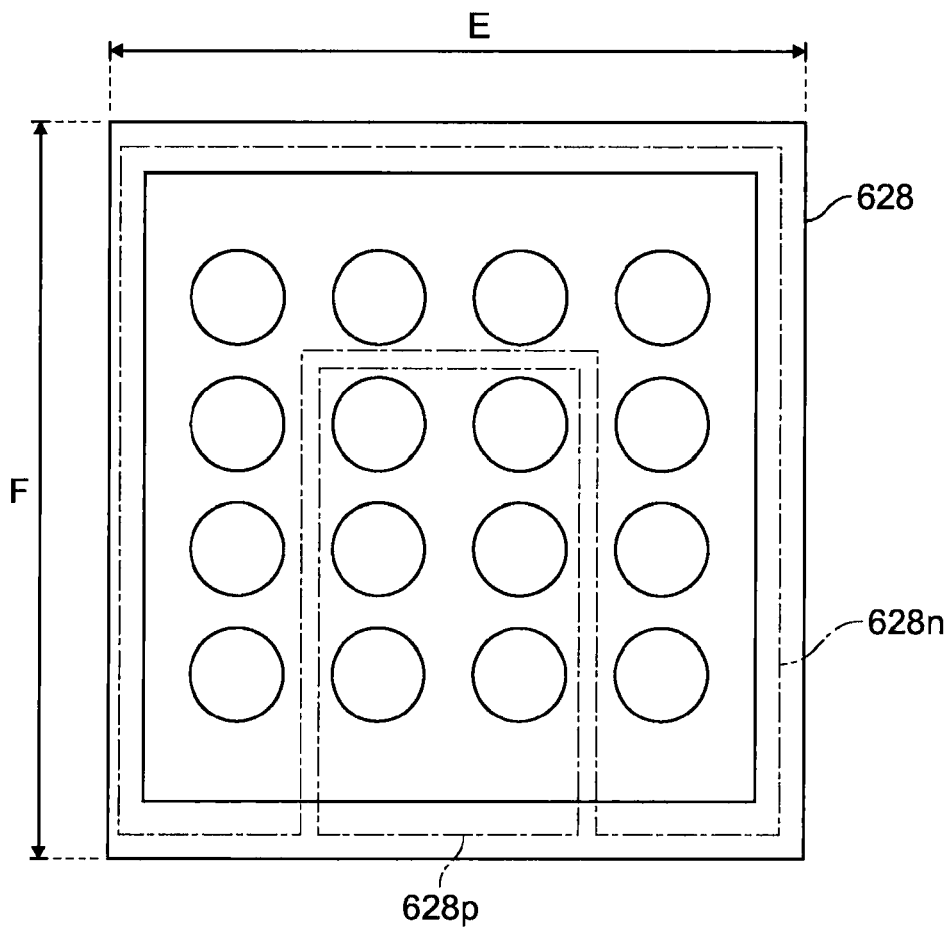

FIG. 6F is a view of the contact side (i.e., the side opposite to the optically-active side) of the LED 628. In this illustration, the contacts are divided into two groups by dotted lines. The first group of ten contacts is the n-contact 628n. The second group of six contacts is the p-contact 628p. Multiple contacts are advantageous, e.g., because distributing contacts across the LED surface increases LED efficiency and the high heat conductivity of the contacts facilitate transferring heat from the LED 628 to the package 600. Because the membrane (e.g., item 625) to which the LED is mounted is relatively thin, it effectively transfers heat out of the package 600. Heat transfer is further enhanced if the package is constructed of a material such as silicon. In this implementation, dimensions E and F are both about 1 millimeter.

III. Third Implementation

Figure 7A:
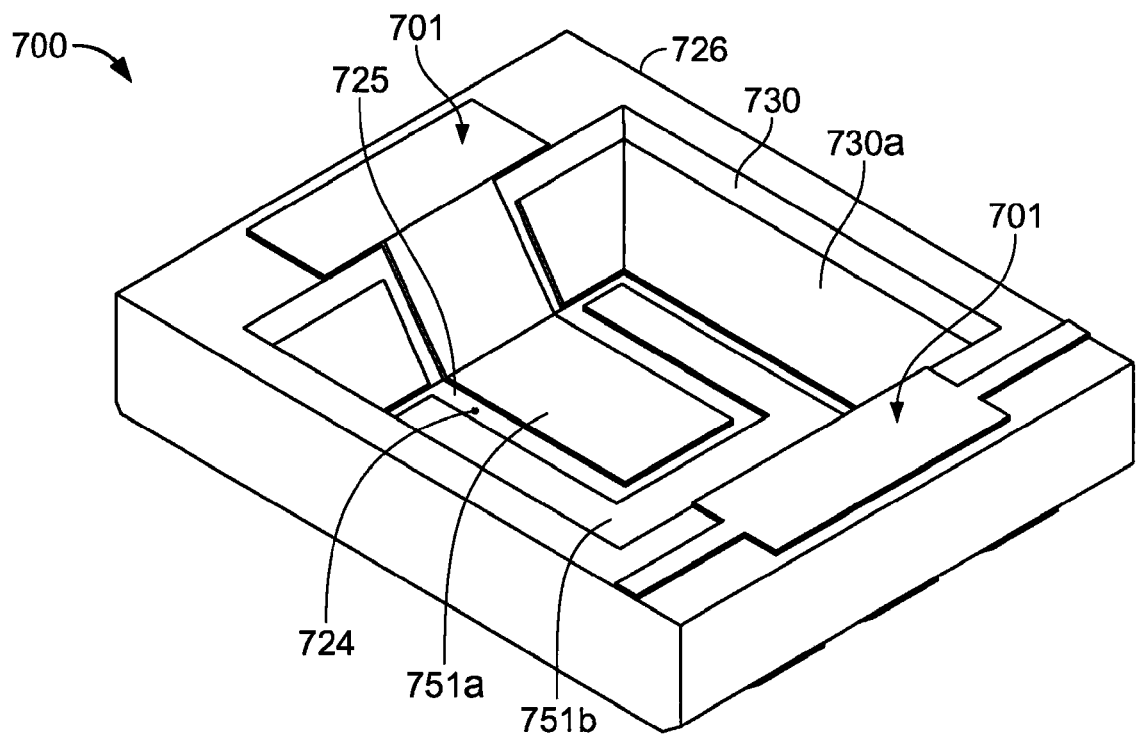
FIGS. 7A-7C illustrate various details of a third example of an optical package.

FIG. 7A illustrates a perspective view of a third implementation of an LED package 700. The package 700, which includes substrate 726 and membrane 725, is in some implementations formed of silicon. The thermal conductivity of silicon is relatively high and the native silicon oxide can be used as an electrical isolator. Alternatively, thicker silicon oxides can be formed by thermal oxidation techniques. Also, silicon allows the use of surface mount technology, which is facilitated by micro-via technology. Silicon also allows wafer-level processing of the LED die attachment, wire bonding, testing and lens attachment (see, e.g., FIGS. 8A-8B). In instances in which the LED used in conjunction with the LED package comprises a silicon substrate, silicon is advantageously used for the package material because compatibility of thermal properties (e.g., the coefficient of thermal expansion) of the LED and the LED package are desirable.

The package 700 includes a recess 724 defined by sidewalls 730 and membrane 725. Sidewalls 730 can be metallized to form a reflective coating 730a. Metallization of the sidewalls increases reflectivity and the light output from the package with an LED mounted in the recess 724. While metals such as aluminum, silver or gold can be used to create the reflective coating 730a, other reflective materials are suitable (including non-metals). To preserve reflectance over time, the reflective coating 730a also can include a protective coating such as, but not limited to, titanium oxide or silicon oxide. A protective coating may also comprise a variety of layers in a sandwich configuration, such as, but not limited to, silver-chromium compound, chromium, silicon oxide and silicon nitride. Also, because in some implementations it is desirable to scatter rather than reflect light from the coating 730a, the reflective coating 730a can be roughened or textured. Alternatively, the protective coating can be roughened or textured.

Contacts 751a and 751b are disposed on the membrane 725. The contacts 751a and 751b, which can include a metal surface and solder coating, are arranged in a manner that corresponds with the contacts of associated LED chip (e.g., item 628) that will be mounted thereto. The contacts 751a and 751b cover a significant amount of the membrane, which can be advantageous for several reasons, including: (1) increased heat transfer from the LED chip to the package 700 (e.g., as a result of the high thermal conductivity of the contacts) and (2) distributing the contacts across the LED surface generally increases the efficiency of the LED. Contacts 751a and 751b are appropriate for use with, e.g., flip chip LEDs with pre-deposited AuSn solder.

Contacts 751a (which can be coupled to the p-contact of an LED) and 751b (which can be coupled to the n-contact of an LED) are coupled to respective test contacts 701. The test contacts are deposited and patterned on the substrate and allow testing and/or burn-in of an LED that coupled to the contacts 751a and 751b. Test contacts 701 are advantageous because it allows testing and/or burn-in without having to (1) mount the package 700 to a PCB or (2) flip the package 700 to expose the through-contacts.

Figure 7B:
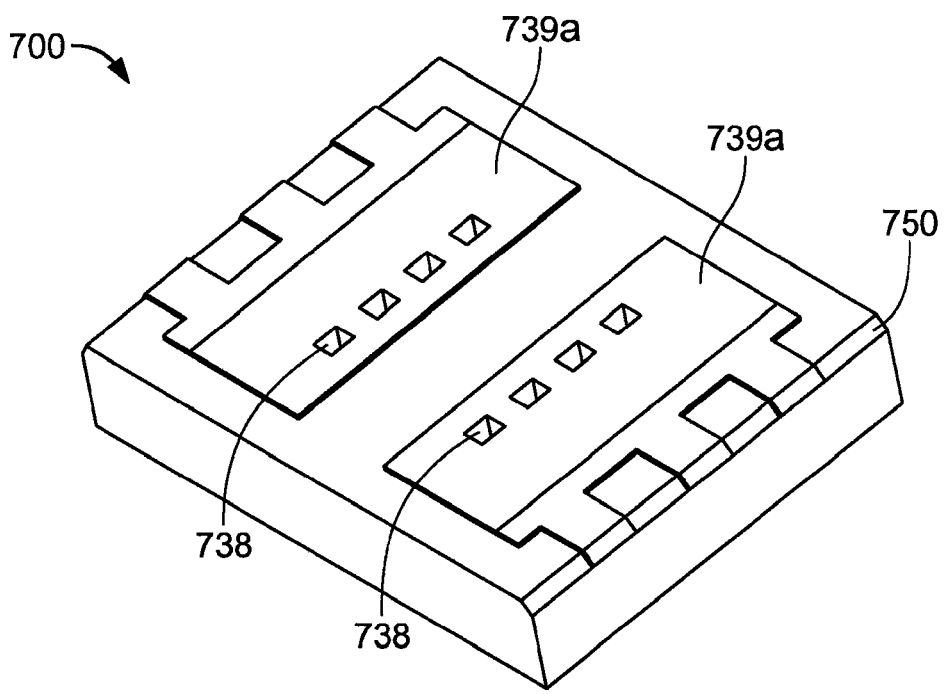
Figure 7C:
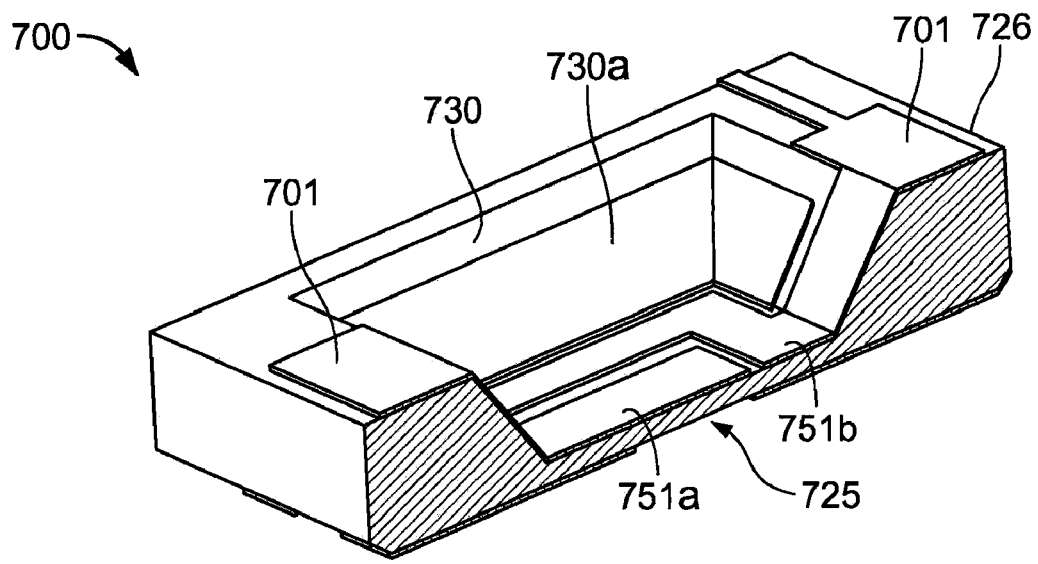

FIGS. 7B and 7C are perspective views of the package 600, illustrating bottom and cross-sectional views thereof. Contacts 751a and 751b (see also FIG. 7A) are provided on a portion of the surface of the membrane 725, which includes electrically conductive through-contacts 738 formed in the thin membrane 725. The electrically conductive through-contacts 738 provide electrical contact from the LED (e.g., item 628) and contacts 751a, 751b through membrane 725 to the package 700 exterior. The conductive through-contacts 738 can be provided, for example, using an electroplated feed-through metallization process and allow the LED to remain sealed hermetically within the package. Other deposition techniques, such as physical vapor deposition (PVD) or chemical vapor deposition (CVD) may be used as well. In some implementations, hermetically sealing the through-holes includes providing a sandwiched stack of different materials, such as, but not limited to, an adhesion layer, a plating base, a feed-through metallization, a diffusion barrier, a wetting layer, and an anti-oxidation barrier that comprises, for example, a noble metal. The through-contacts 738 can be electrically coupled to under-bump metallization pads 739a that facilitate electrical connection to the LED mounted within the package 700. UBM pads 739a can serve the additional purpose of conducting heat from the package 700 to the surface to which it is mounted.

Bevel 750, which can surround edges of package 700 proximate to the metal pads 739a, is an etched feature that can facilitate, e.g., solder inspection after the package 700 is mounted to a printed circuit board (PCB). Bevels 750 are fully or partially covered with under-bump metallization (UBM) 739a. During PCB mounting, the solder will form a meniscus shape that can be inspected by top view means.

The package 700 of this implementation can have the same dimensions as, for example, the implementation of FIGS. 6A-6E.

IV. Additional Advantages of a Silicon Substrate

Figure 8A:
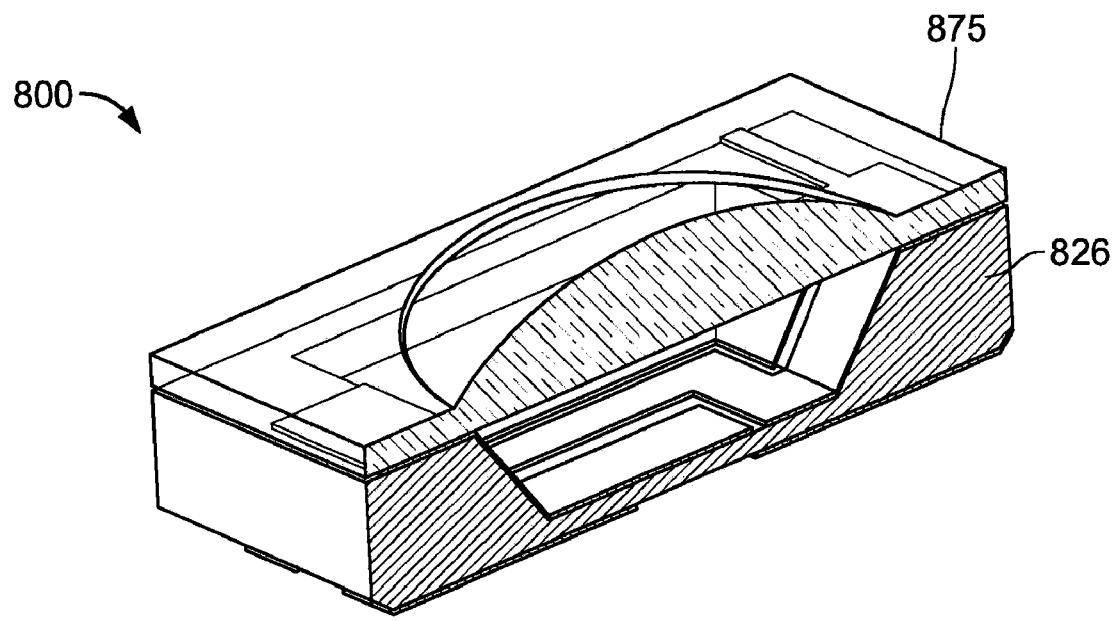
FIGS. 8A-8B illustrate an implementation of an optical package that includes a lens.

FIG. 8A illustrates a cross-sectional view of a package 800 that includes a substrate 826 and a lens 875. The lens 875 can be used to focus the light output of the LED and simultaneously seal the package, thereby protecting the LED. The lens 875 can be constructed of glass or plastic and can have optical properties designed for the implementation.

Figure 8B:
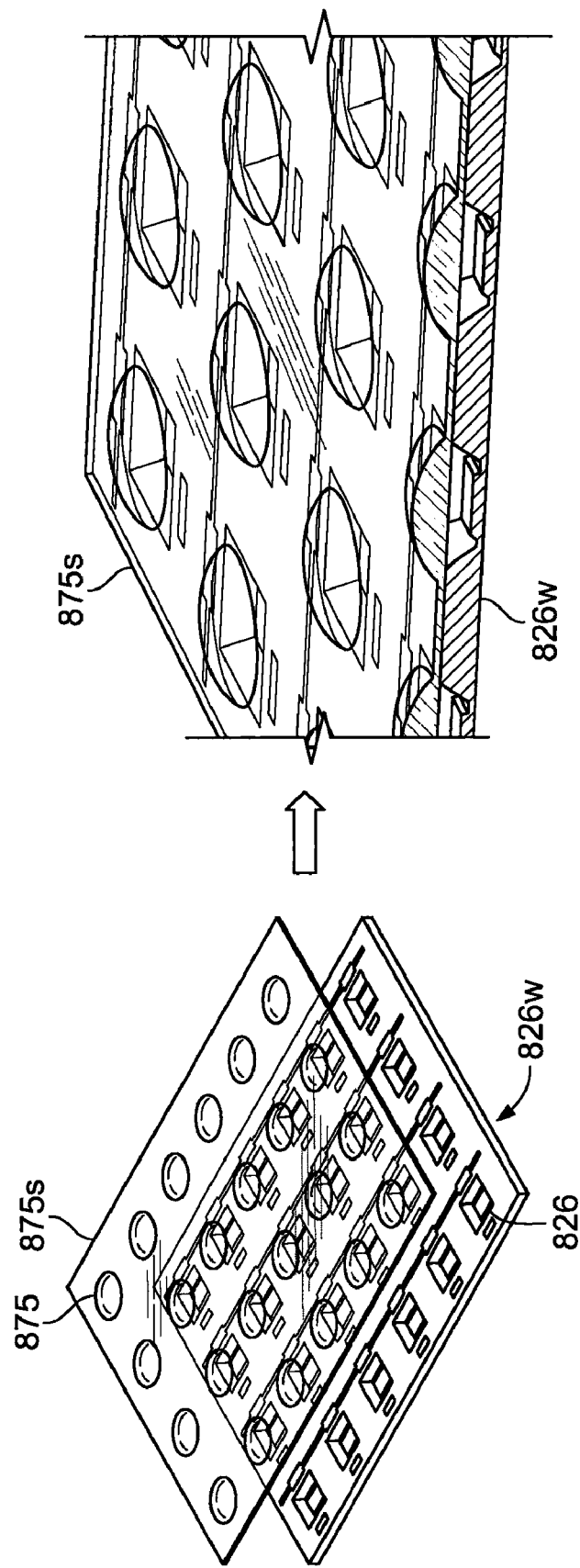

FIG. 8B illustrates an assembly process for the package 800, facilitated by the use of a silicon substrate 826. Silicon wafer 826w comprises multiple areas for individual LED package substrates 826 formed thereon. Lens sheet 875s comprises a plurality of lenses 875 formed thereon. By utilizing wafer level processing, multiple packages 800 can be formed simultaneously, thereby decreasing production time and cost. Further advantages of wafer level processes include encapsulation, functional testing and burn-in.

V. Additional Implementations

Figure 9A:
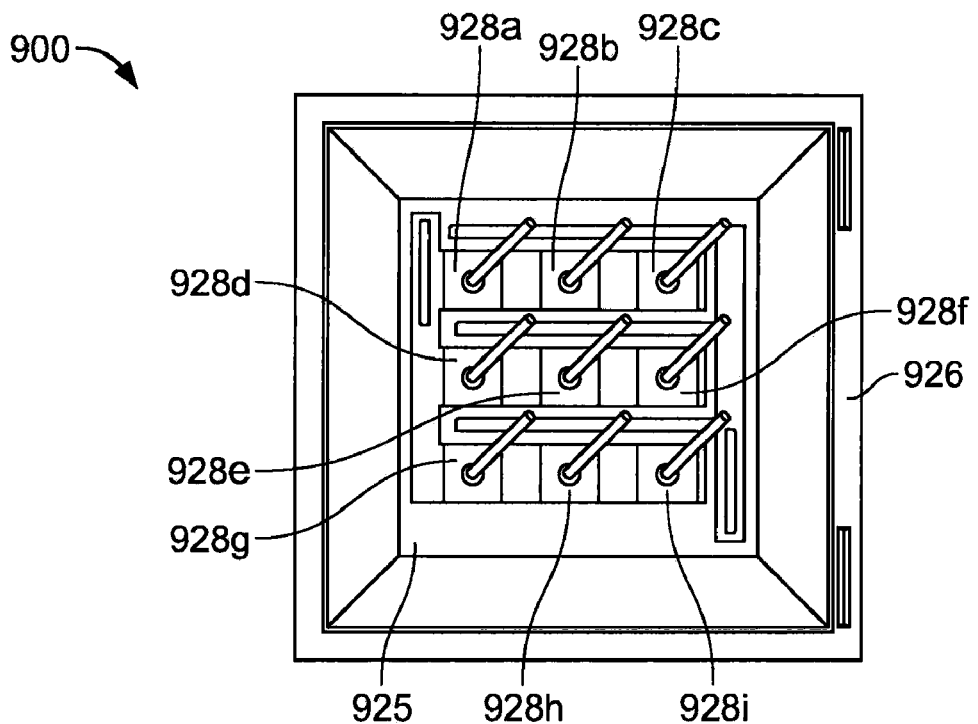
FIGS. 9A-9B illustrate an implementation of an optical package that includes an array of LEDs.
Figure 9B:
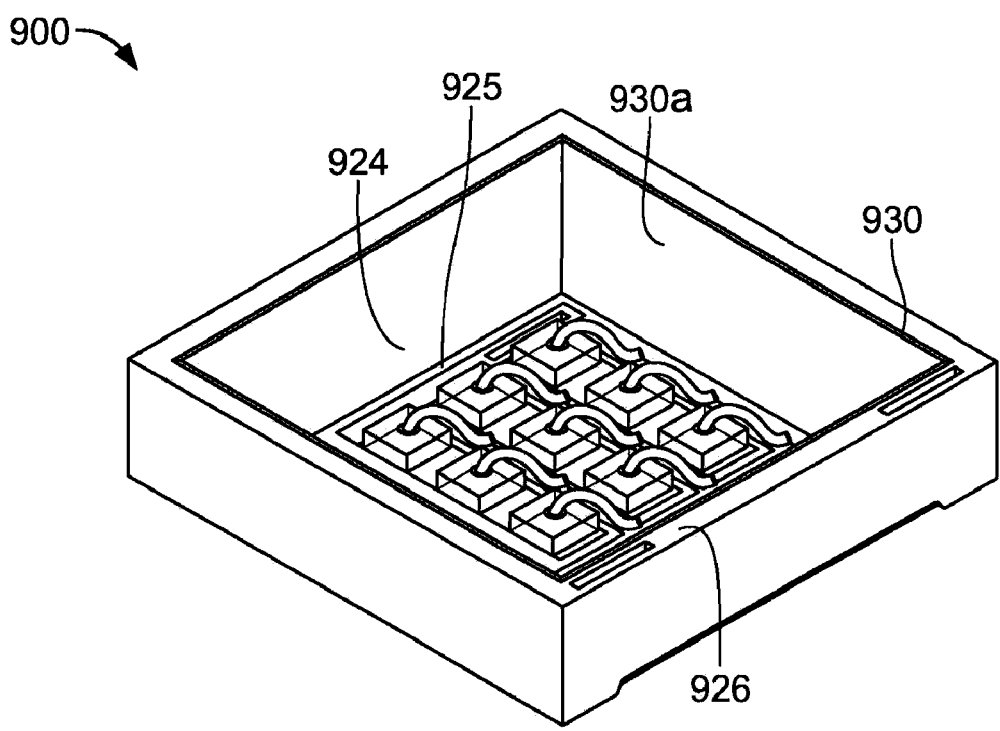

FIGS. 9A and 9B illustrate an implementation of package a 900 that includes an array of nine LEDs 928a-928i. This implementation can be useful where a larger light output is needed than is possible from one single LED. The package 900 is larger than the previously described implementations, measuring approximately 2.6 millimeters by 2.6 millimeters. The nine LEDs 928a-928i can be driven independently, or multiple LEDs can be wired in series, parallel or any combination thereof.

The package 900, which includes substrate 926 and thin membrane 925, is in some implementations formed of silicon. The thermal conductivity of silicon is relatively high and the native silicon oxide can be used as an electrical isolator. Alternatively, thicker silicon oxides can be formed by thermal oxidation techniques. Also, silicon allows the use of surface mount technology, which is facilitated by micro-via technology. Silicon also allows wafer-level processing of the LED die attachment, testing and lens attachment (see, e.g., FIGS. 8A-8B). In instances in which the LED used in conjunction with the LED package comprises a silicon substrate, silicon is advantageously used for the package material because compatibility of thermal properties (e.g., the coefficient of thermal expansion) of the LED and the LED package are desirable.

The package 900 includes a recess 924 defined by sidewalls 930 and membrane 925. Sidewalls 930 can be metallized to form a reflective coating 930a. This increases reflectivity and the light output of an LED that is mounted in the recess 924. While metals such as aluminum, silver or gold can be used to create the reflective coating 930a, other reflective materials are suitable (including non-metals). To preserve reflectance over time, the reflective coating 930a may also include a protective coating such as, but not limited to, titanium oxide or silicon oxide, A protective coating may also comprise a variety of layers in a sandwich configuration, such as, but not limited to, silver-chromium compound, chromium, silicon oxide and silicon nitride. Also, because in some implementations it is desirable to scatter than reflect light from the coating 930a, the reflective coating 930a can be roughened or textured. Alternatively, the protective coating can be roughened or textured.

Figure 10:
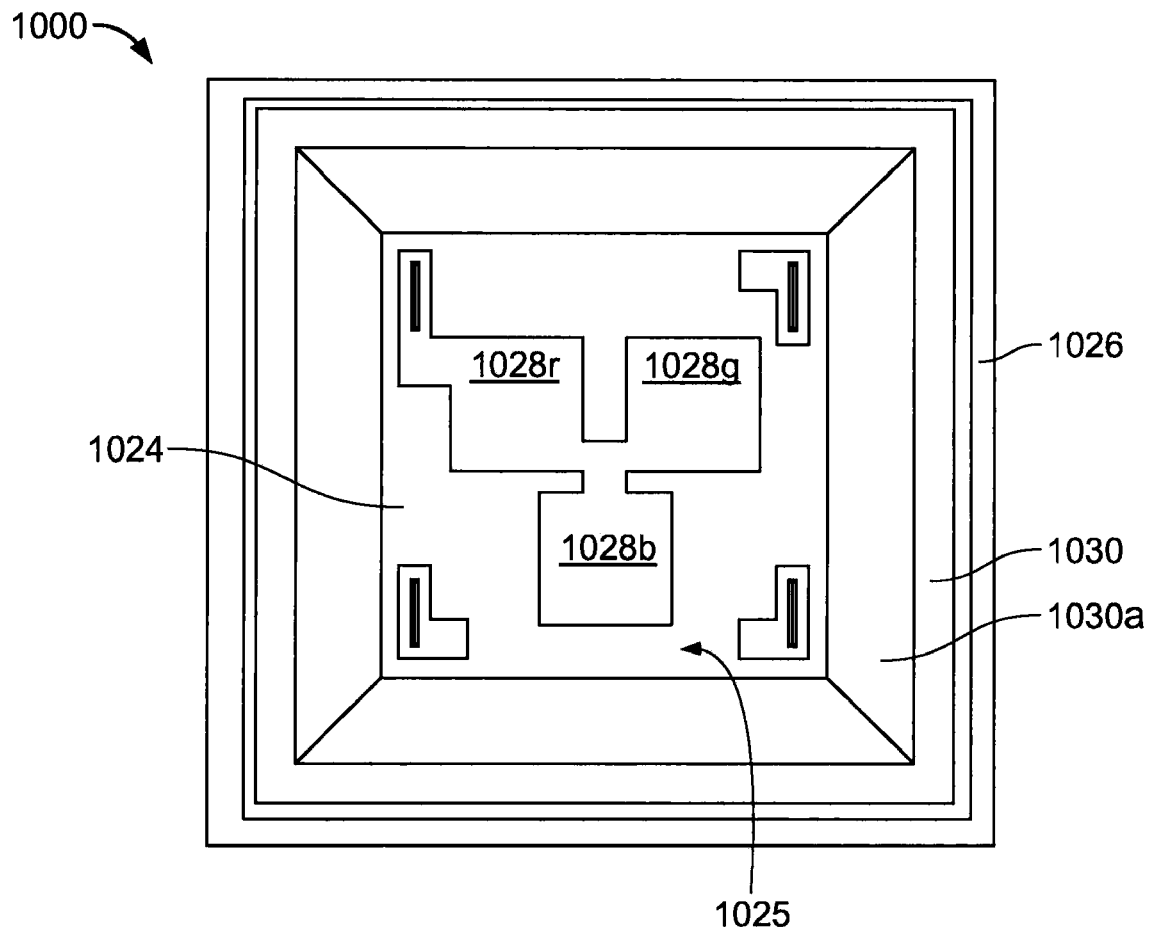
FIG. 10 illustrates an implementation of an optical package that includes red, green and blue light emitting elements (RGB configuration).

FIG. 10 illustrates an implementation of package 1000 that includes an array of three LEDs 1028r, 1028g and 1028b. These LEDs emit, respectively, red, green and blue light. This implementation can be useful in constructing a video display, e.g., using a plurality of packages 1000 as pixel elements. For video display use, it is generally preferred that each LEDs 1028r, 1028g and 1028b be driven independently. However, in implementations where this arrangement is used simply to provide high-brightness white light, the LEDs can be driven together.

The package 1000, which includes substrate 1026 and membrane 1025, is in some implementations formed of silicon. The thermal conductivity of silicon is relatively high and the native silicon oxide can be used as an electrical isolator. Alternatively, thicker silicon oxides can be formed by thermal oxidation techniques. Also, silicon allows the use of surface mount technology, which is facilitated by micro-via technology. Silicon also allows wafer-level processing of the LED die attachment, testing and lens attachment (see, e.g., FIGS. 8A-8B). In instances in which the LED used in conjunction with the LED package comprises a silicon substrate, silicon is advantageously used for the package material because compatibility of thermal properties (e.g., the coefficient of thermal expansion) of the LED and the LED package are desirable.

The package 1000 includes a recess 1024 defined by sidewalls 1030 and membrane 1025. Sidewalls 1030 can be metallized to form a reflective coating 1030a. Metallization increases reflectivity and the light output of an LED that is mounted in the recess 1024. While metals such as aluminum, silver or gold can be used to create the reflective coating 1030a, other reflective materials are suitable (including non-metals). To preserve reflectance over time, the reflective coating 1030a also can include a protective coating such as, but not limited to, titanium oxide or silicon oxide. A protective coating may also comprise a variety of layers in a sandwich configuration, such as, but not limited to, silver-chromium compound, chromium, silicon oxide and silicon nitride. Also, because in some implementations it is desirable to scatter than reflect light from the coating 1030a, the reflective coating 1030a can be roughened or textured. Alternatively, the protective coating can be roughened or textured.

Figure 11:
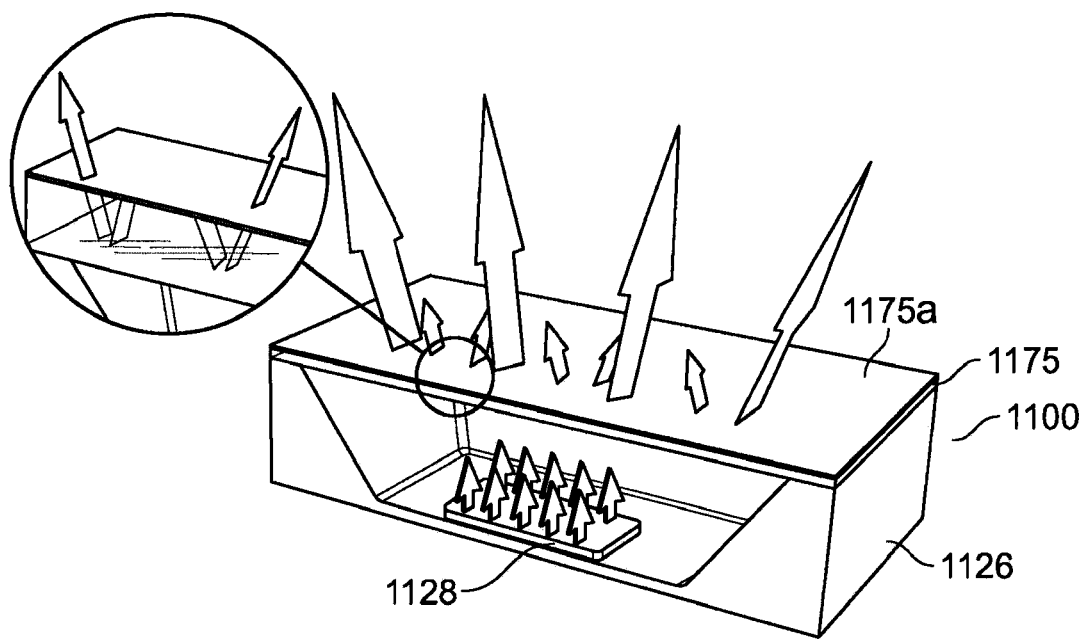
FIG. 11 illustrates an implementation of an optical package that includes a lid and color conversion material.

FIG. 11 illustrates a package 1100 comprising a substrate 1126, LED 1128 and lid 1175. The lid 1175 comprises a color conversion layer 1175a. The color conversion layer 1175a can operate by filtering certain wavelengths of light, or may use a phosphor-type coating that is excited by the light emitted by the LED 1128. The lid 1175 can be, for example, a Fresnel or diffractive type.

A number of implementations of the invention have been described. Nevertheless, it will be understood that various modifications may be made without departing from the spirit and scope of the invention. For example, various features (including, e.g., the thickness of the thin silicon membrane on which the LED mounted) described in connection with one of the foregoing implementations can be used in conjunction with other implementations as well. Accordingly, other implementations are within the scope of the claims.

What is claimed is:

1. An LED package comprising:
   an LED chip having an optically active layer on a substrate;
   a platform, formed by a supporting frame surrounding a recessed membrane on which the LED chip is mounted in close thermal contact to the material of the platform, wherein the membrane is provided with one or more electrically isolated through-contacts made from electrically conducting material and connected to respective electrodes of the LED chip, wherein the LED chip has a side length dimension E, a thickness of the membrane is less than $3/10$ the LED chip dimension (E) and a thickness of the supporting frame is more than twice the membrane thickness.

2. The LED package according to claim 1 wherein the electrically conducting material is a semiconductor.

3. The LED package according to claim 1 wherein the electrically conducting material is a conductor.

4. The LED package according to claim 1, wherein the through contact has the shape of a hole or of planar areas.

5. The LED package according to any one of claims 1-4, inclusive, wherein the LED has a side length dimension E, the thickness of the membrane is less than $1/10$ the LED chip dimension (E) and the thickness of the supporting frame is more than twice the membrane thickness.

6. The LED package according to any one of claims 1-4, inclusive, wherein the LED chip is mounted in flip chip technology and wherein the membrane comprises a plurality of through-holes respectively filled with electrically conducting material and connected to respective electrodes of the LED chip.

7. The LED package according to any one of claims 1-4, inclusive, wherein the platform is made from silicon.

8. The LED package according to any one of claims 1-4, inclusive, wherein the LED chip is mounted onto the platform without using a separate sub-mount.

9. The LED package according to any one of claims 1-4, inclusive, wherein walls surrounding the membrane form a cavity and are arranged to reflect light emitted from the LED chip.

10. The LED package according to claim 9 wherein the walls of the cavity are coated with a reflecting material.

11. The LED package according to claim 10 wherein the reflecting material is textured so as to scatter light emitted by the LED.

12. The LED package according to claim 10 wherein the reflecting material is coated by a protective layer.

13. The LED package according to claim 10 wherein the reflecting material comprises gold, silver, or aluminum.

14. The LED package according to any one of claims 1-4, inclusive, wherein the frame of the platform has a thickness of at least twice the membrane thickness.

15. The LED package according to any one of claims 1-4, inclusive, comprising a color conversion material disposed opposite the optically active layer of the LED chip.

16. The LED package according to claim 1 wherein the membrane is between about 40 and 80 microns thick.

17. The LED package according to claim 1 wherein the frame is between about 100 and 200 microns thick.

18. The LED package according to claim 1 wherein the frame is between about 100 and 410 microns thick.

19. The LED package according to claim 1 wherein the LED chip is bonded to the membrane by adhesive die attach.

20. The LED package according to claim 1 wherein the LED chip is bonded to the membrane by solder die attach.

21. The LED package according to claim 1 further comprising a plurality of test contacts disposed on the frame, each test contact electrically coupled to a respective electrode of the LED.

22. The LED package according to claim 1 further comprising a plurality of metal pads disposed on a surface of the platform opposite to a surface of the membrane to which the LED is mounted, the metal pads electrically coupled to respective through-contacts.

23. The LED package according to claim 22 further comprising an aligned metal pad disposed on a surface of the platform opposite to the membrane surface to which the LED is mounted and substantially aligned with the location of the LED.

24. The LED package according to claim 23 wherein the aligned metal pad is electrically coupled to one of the metal pads.

25. The LED package according to claim 1 wherein the electrically conducting material is a metal.

26. The LED package according to claim 1 wherein the electrically conducting material is a stack comprising a variety of metals.

27. The LED package according to claim 1 wherein the membrane is between about 100 and 200 microns thick.

28. The LED package according to claim 1 wherein the frame is between about 100 and 700 microns thick.

29. The LED package according to any one of claims 1-4, inclusive, comprising a lid coupled with the supporting frame, the lid including a color conversion material.

30. An LED package, comprising; an LED chip having an optically active layer on a substrate; a submount comprising a central recessed membrane, wherein the LED chip is mounted on the membrane in close thermal contact to the material of the submount, the thickness of the membrane being less than 100 microns and the thickness of a frame of the submount, which is integrally formed with the membrane, is substantially larger than the thickness of the membrane.

31. The LED package according to claim 30 wherein the submount is made from silicon.

32. The LED package according to any one of claims 30-31, inclusive, wherein walls surrounding the membrane form a cavity and are arranged to reflect light emitted from the LED chip.

33. The LED package according to claim 32 wherein the walls of the cavity are coated with a reflecting material.

34. The LED package according to claim 33 wherein the reflecting material is textured so as to scatter light emitted by the LED.

35. The LED package according to claim 33 wherein the reflecting material is coated by a protective layer.

36. The LED package according to any one of claims 30-31, inclusive, wherein the frame of the submount has a thickness of at least 300 microns.

37. The LED package according to any one of claims 30-31, inclusive, further comprising a color conversion material disposed opposite the optically active layer of the LED chip.

38. The LED package according to any one of claims 30-31 inclusive, wherein the membrane comprises at least a through-hole filled with electrically conducting material and connected to an electrode of the LED chip.

39. The LED package according to claim 38 further comprising a plurality of metal pads disposed on a surface of the submount opposite to the membrane surface to which the LED is mounted, the metal pads electrically coupled to respective through-holes.

40. The LED package according to claim 38 further comprising an aligned metal pad disposed on a surface of the platform opposite to the membrane surface to which the LED is mounted and substantially aligned with the location of the LED.

41. The LED package according to claim 40 wherein the aligned metal pad is electrically coupled to one of the metal pads.

42. The LED package according to any one of claims 30-31, inclusive, wherein the LED chip is mounted in flip chip technology and wherein the membrane comprises a plurality of through-holes respectively filled with electrically conducting material and connected to respective electrodes of the LED chip.

43. The LED package according to claim 30 wherein the membrane is between about 40 and 80 microns thick.

44. The LED package according to claim 30 wherein the LED chip is bonded to the membrane by adhesive die attach.

45. The LED package according to claim 30 wherein the LED chip is bonded to the membrane by solder die attach.

46. The LED package according to claim 30 further comprising a plurality of test contacts disposed on the frame, each test contact electrically coupled to a respective electrode of the LED.

47. The LED package of claim 30 wherein the frame of the submount has a thickness of about 410 microns and the membrane has a thickness of about 60 microns.

48. The LED package of claim 30 the membrane is between about 40 and 80 microns thick.

49. The LED package of claim 30 wherein the membrane is about 60 microns thick.

50. The LED package of claim 30 wherein the maximum thickness of the frame is between about 200 and 410 microns thick.

51. An LED package comprising; an LED chip having an optically active layer on a substrate, a submount comprising a central recessed membrane, wherein the LED chip is mounted to the membrane in close thermal contact to the material of the submount, the thickness of the membrane being less than 100 microns and the thickness of a frame of the submount which is integrally formed with the membrane, is substantially larger than the thickness of the membrane, wherein the submount is made from silicon.

52. An LED package, comprising; an LED chip having an optically active layer on a substrate, a submount comprising a central recessed membrane, wherein the LED chip is mounted to the membrane in close thermal contact to the material of the submount, the thickness of the membrane being less than 100 microns and the thickness of a frame of the submount, which is integrally formed with the membrane, is substantially larger than the thickness of the membrane, wherein the membrane comprises at least one through-hole filled with electrically conducting material electrically connected to an electrode of the LED chip.

53. A light emitting device package comprising:
a substrate including a platform portion surrounded by a supporting frame portion;
a recess disposed in the substrate, wherein the platform portion forms a bottom portion of the recess;
a light emitting device chip disposed on the platform portion of the substrate, such that the light emitting chip is in thermal contact with the platform portion, wherein the light emitting device chip has a dimension E and a thickness of the platform portion is less than $3/10$ the light emitting device chip dimension E and a thickness of the supporting frame portion is more than twice the platform portion thickness; and
one or more electrically isolated through-contacts disposed in the platform portion made from electrically conducting material and connected to respective electrodes of the light emitting device chip.

54. The light emitting device package according to claim 53 wherein the light emitting device chip is mounted in flip chip technology and wherein the platform portion comprises a plurality of through-holes respectively filled with electrically conducting material and connected to respective electrodes of the light emitting device chip.

55. The light emitting device package according to claim 53 wherein the substrate is made from silicon.

* * * * *